United States Patent [19]

Saitoo et al.

[11] Patent Number: 4,984,200
[45] Date of Patent: Jan. 8, 1991

[54] SEMICONDUCTOR CIRCUIT DEVICE HAVING A PLURALITY OF SRAM TYPE MEMORY CELL ARRANGEMENT

[75] Inventors: Ryuichi Saitoo, Ithaca, N.Y.; Osamu Saitoo, Tokyo, Japan; Takahide Ikeda, Tokorozawa, Japan; Mitsuru Hirao, Tohkai, Japan; Atsushi Hiraishi, Hitachi, Japan

[73] Assignee: Hitachi, Ltd., Tokyo, Japan

[21] Appl. No.: 271,309

[22] Filed: Nov. 15, 1988

[30] Foreign Application Priority Data

| Nov. 30, 1987 | [JP] | Japan | 62-305466 |
| Nov. 30, 1987 | [JP] | Japan | 62-305467 |
| Dec. 18, 1987 | [JP] | Japan | 62-320935 |

[51] Int. Cl.$^5$ .............. G11C 11/40; H01L 27/04; H01L 29/78
[52] U.S. Cl. .............. 365/154; 365/156; 365/182; 357/23.9; 357/23.6; 437/52
[58] Field of Search ............. 365/154, 182, 156, 149; 357/23.9, 41, 29, 84, 23.6; 437/29, 41, 52, 60; 148/DIG. 148, DIG. 52

[56] References Cited

U.S. PATENT DOCUMENTS

| 4,590,508 | 5/1986 | Hirakawa et al. | 357/23.6 |
| 4,679,171 | 7/1987 | Logwood et al. | 357/23.9 |
| 4,774,203 | 9/1988 | Ikeda et al. | 437/52 X |
| 4,805,147 | 2/1989 | Yamanaka et al. | 365/154 X |
| 4,828,629 | 3/1989 | Ikeda et al. | 437/52 |
| 4,841,481 | 6/1989 | Ikeda et al. | 365/156 |

FOREIGN PATENT DOCUMENTS

| 62-121998 | 6/1987 | Japan | 365/182 |
| 62-249475 | 11/1987 | Japan | 437/52 |
| 2092826 | 8/1982 | United Kingdom | 437/52 |

OTHER PUBLICATIONS

Nikkei Microdevices, Aug. 87, pp. 84–86 by Nikkei McGraw-Hill.

Primary Examiner—Stuart N. Hecker
Assistant Examiner—Alfonso Garcia
Attorney, Agent, or Firm—Antonelli, Terry, Stout & Kraus

[57] ABSTRACT

Herein disclosed is a semiconductor integrated circuit device comprising a SRAM which is composed of a memory cell having its high resistance load element and power source voltage line connected with the information storage node of a flip-flop circuit through a conductive layer. At the same fabrication step as that of forming the plate electrode layer of a capacity element over the conductive layer formed on the portion of the information storage node through a dielectric film, an electric field shielding film for shielding the field effect of a data line is formed over the high resistance load element through an inter-layer insulation film.

20 Claims, 14 Drawing Sheets

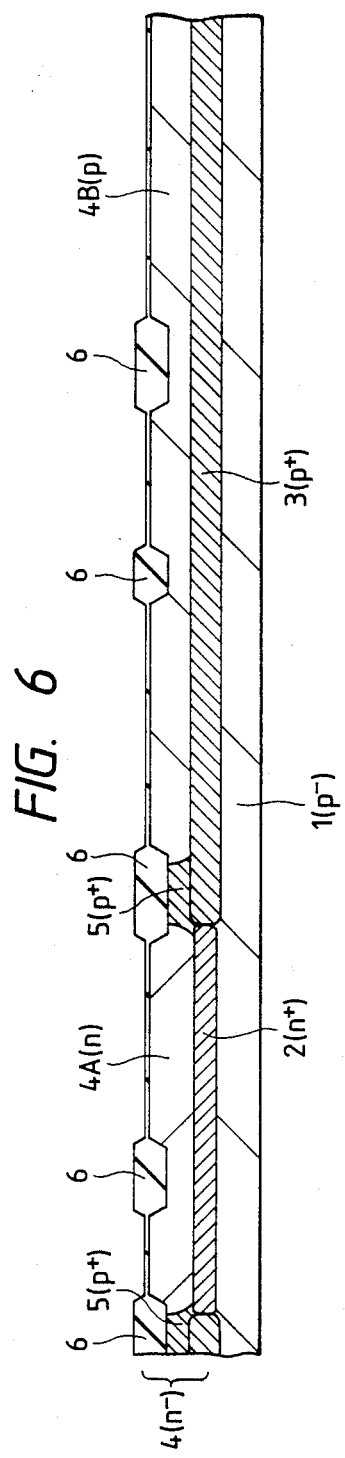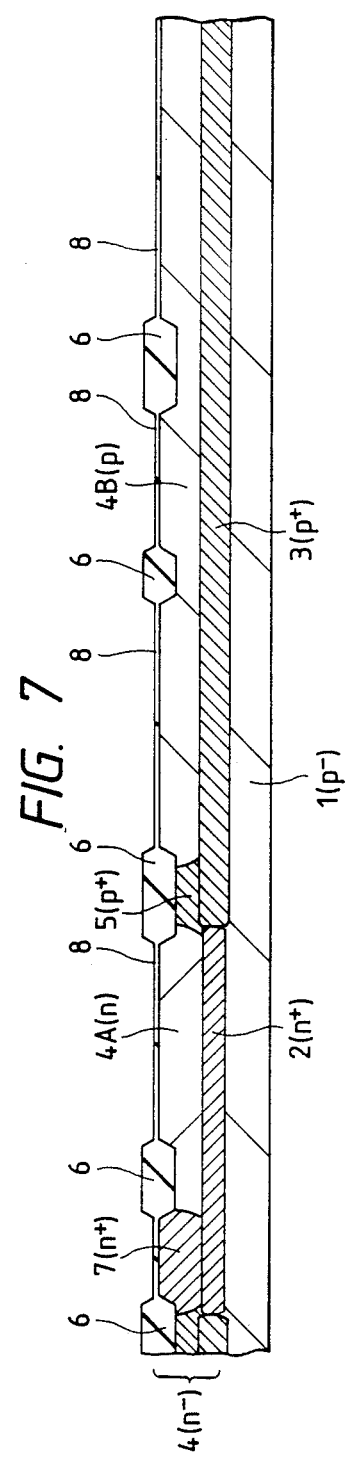

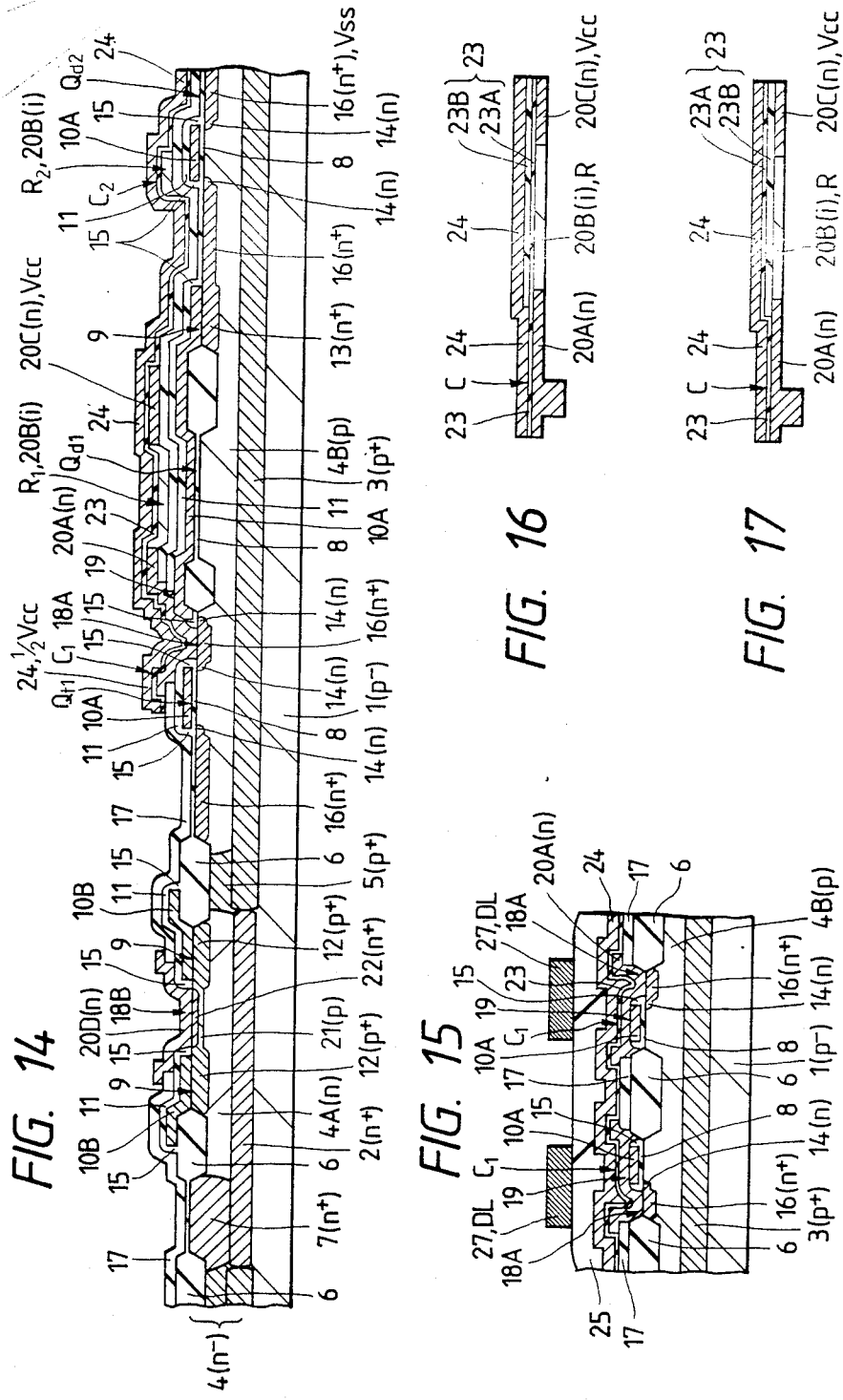

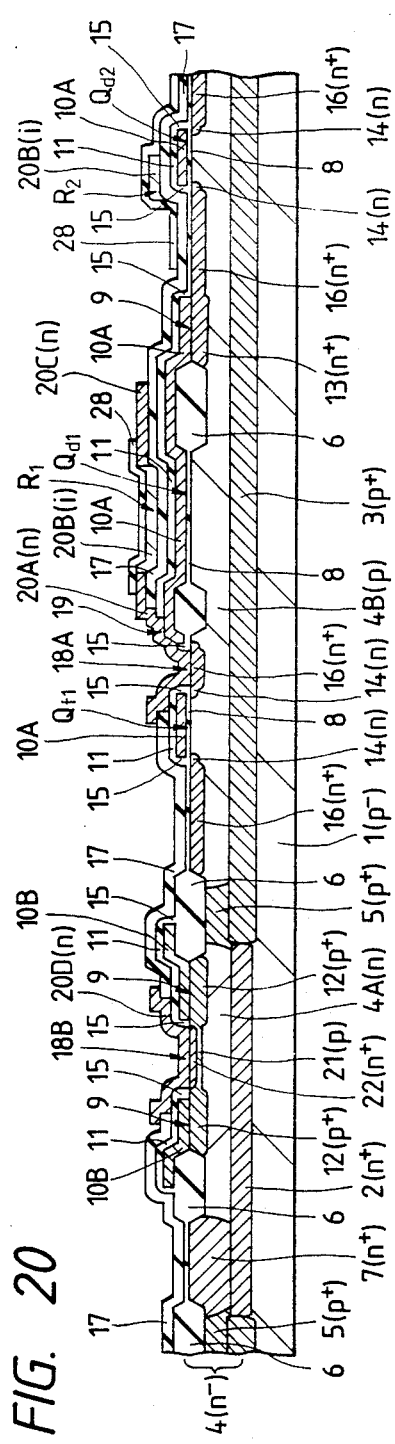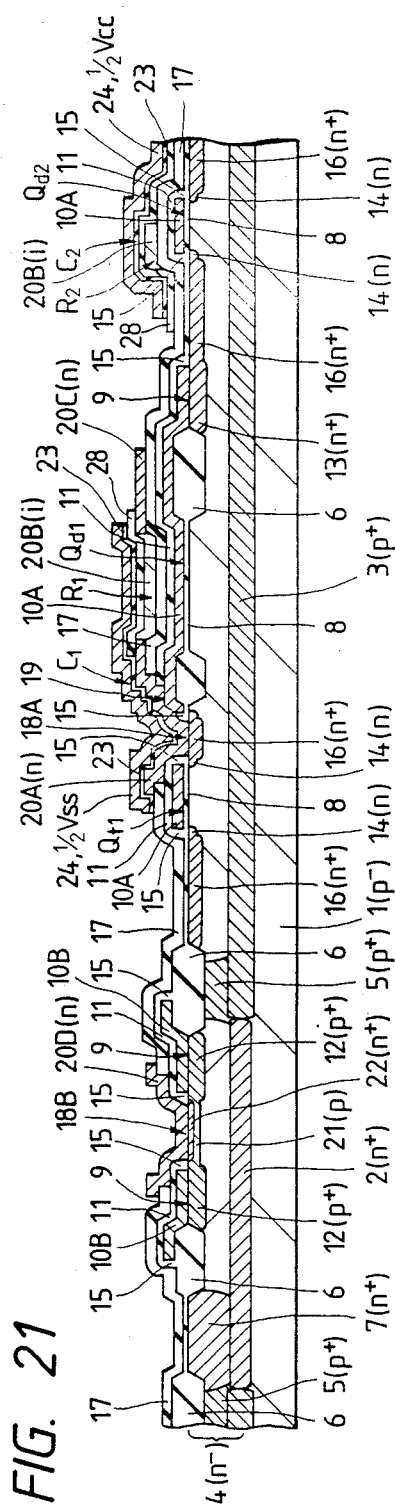

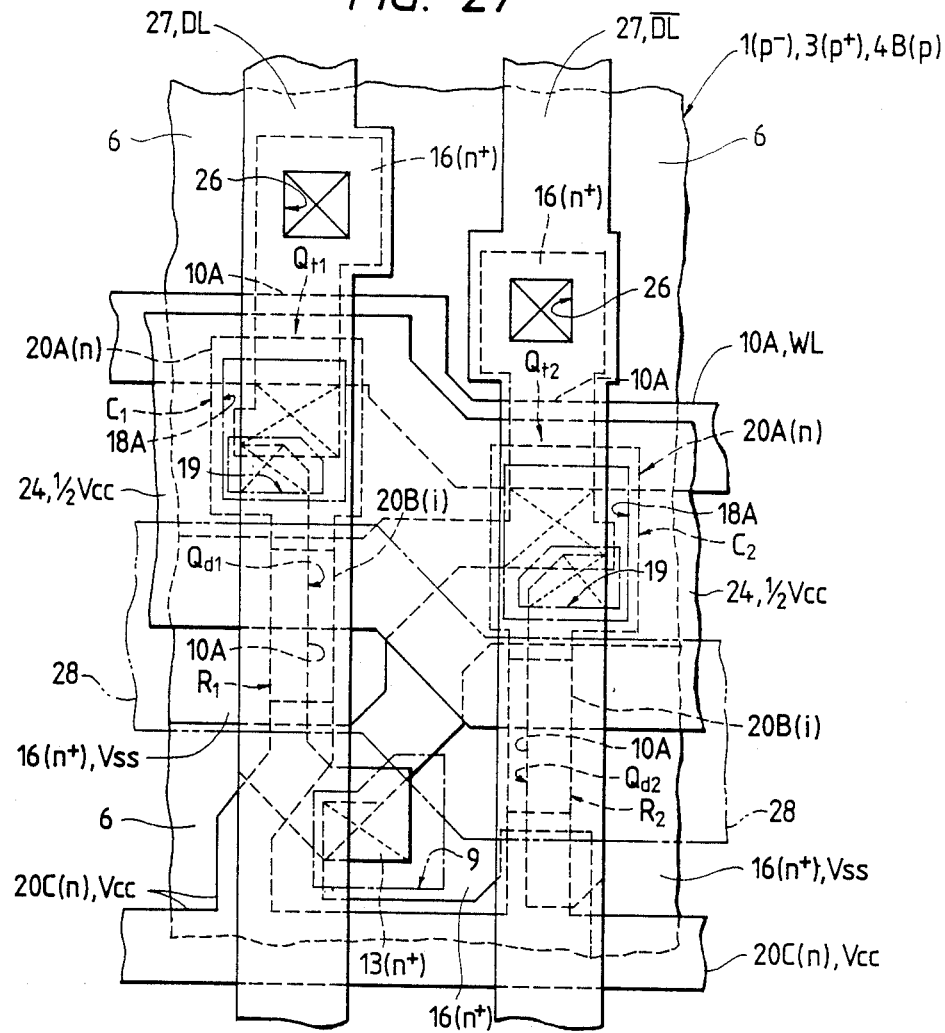

SEMICONDUCTOR CIRCUIT DEVICE HAVING A PLURALITY OF SRAM TYPE MEMORY CELL ARRANGEMENT

BACKGROUND OF THE INVENTION

The present invention relates to a semiconductor integrated circuit device and, more particularly, to techniques effective when applied to a semiconductor integrated circuit device having a SRAM (Static Random Access Memory).

The SRAM has a memory cell arranged at the intersections between complementary data lines and a word line. The memory cell is composed of a flip-flop circuit and two transfer MISFETs having their individual semiconductor regions connected with the paired input-/output terminals of the flip-flop circuit.

The flip-flop circuit is used as an information storage unit and has its input/terminal portions acting as information storage nodes. The flip-flop circuit is composed of two driver MISFETs and two high resistance load elements. These high resistance load elements are made of a polycrystalline silicon film which is doped with none or a slight amount of impurity for reducing the resistance. The high resistance load elements are arranged over the gate electrodes of the driver MISFETs. These high resistance load elements are featured by reducing the area of the memory cell to highly integrate the SRAM because they are arranged over the driver MISFETs.

The transfer MISFETs have their one-side semiconductor regions connected with the gate electrodes of the driver MISFETs. These connections are effected by forming connection holes in an insulation film over the one-side semiconductor regions of the transfer MISFETs and by extending the one-end sides of the gate electrodes of the driver MISFETs through the connection holes to connect them directly with the one-side semiconductor regions of the transfer MISFETs.

The gate electrodes of the transfer MISFETs of the memory cell are connected with a word line. The other semiconductor regions of the transfer MISFETs are connected with complementary data lines. These complementary data lines are constructed to extend over the high-resistance load elements. A power source voltage line and a reference voltage line are connected through the high resistance load elements and the driver MISFETs, respectively, with the information storage nodes of the flip-flop circuit of the memory cell.

The memory cell of this kind has a tendency to have its size reduced the more, as the high integration advances, thereby to drop the charge storages of the information storage nodes. This drop of the charge storages is liable to destroy the information storage nodes (so called softerror) due to the incidence of alpha rays.

The most proper technique for solving this problem is disclosed in U.S. Pat. No. 4,590,508. According to this technique, capacitance elements are connected with the information storage nodes of the memory cell of the SRAM to increase the charge storages of the information storage nodes. These capacitance elements are constructed by incorporating a dielectric film while using the gate electrodes of the driver MISFETs as one electrode and by laminating a polycrytalline silicon film as the other electrode.

Incidentally, the SRAM is disclosed on pp. 71 to 87 of "Nikkei Micro-Device" published in August, 1987 by Nikkei McGrow-Hill, for example.

SUMMARY OF THE INVENTION

We have investigated the aforementioned SRAM and we have discovered the following problems associated therewith.

First of all, in the memory cell, a parasitic channel is established in the high resistance load elements to increase the standby current flow.

The high resistance load elements of the memory cell of the SRAM have a relatively steady current flow because they are passive elements. Over these high resistance load elements, there extend complementary data lines through an inter-layer insulation film, as has been described hereinbefore. In this memory cell, there is formed a parasitic MOS which has the complementary data lines acting as its gate electrode, the inter-layer insulation film acting as its gate insulation film, and the high resistance load elements as its channel region. This parasitic MOS causes to establish the parasitic channel in the high resistance load elements by the field effect coming from the complementary data lines. If the parasitic channel is formed in the high resistance load elements, these elements have their resistances fluctuating with the potential voltage change of the data lines so that the flow rate of the current to be fed to the information storage nodes of the memory cell is increased to augment the standby current flow rate. This increases the power consumption of the SRAM.

Moreover, a passivation (or protective) film is formed over the complementary data lines. The passivation film to be used is made of a silicon nitride film which is deposited by the plasma CVD. This plasma silicon nitride film releases hydrogen, which will migrate into the polycrysalline silicon film forming the high resistance load elements. If this hydrogen migration takes place, the so-called "particle boundary passivation-effect" is manifested to improve the crystal properties of the silicon. As a result, the threshold voltage of the aforementioned parasitic MOS drops to increase the standby current flow rate and accordingly the power consumption of the SRAM.

Secondly, in the memory cell of the SRAM, there is required a large area for connecting the one-side semiconductor regions of the transfer MISFETs and the gate electrodes of the driver MISFETs. The following area is added to that area for the connections. That is to say: (1) The area for isolating the gate electrodes of the transfer MISFETs and the gate electrodes of the driver MISFETs. The isolation size of the gate electrodes corresponds to the working size for the fabrication; (2) The area for connecting the one-side semiconductor regions of the transfer MISFETs and the gate electrodes of the driver MISFETs; and (3) The masking allowance area at the fabrication step between the one-side semiconductor regions of the transfer MISFETs and the gate electrodes of the drive MISFETs. As a result, the memory cell area is increased to drop the level integration of the SRAM.

An object of the present invention is to provide a technique capable of reducing the area of the memory cell of a SRAM of a semiconductor integrated circuit device to improve the level integration capability thereof.

Another object of the present invention is to provide a technique capable of achieving the above-specified object without increasing the number of conductive layers in the memory cell.

Still another object of the present invention is to provide a technique capable of achieving the above-specified objects and improving the breakdown voltage between the memory cells.

A further object of the present invention is to provide a technique capable of preventing any software error from the SRAM and reducing the power consumption.

A further object of the present invention is to provide a technique capable of preventing any increase in the standby current flow rate due to the parasitic MOS.

A further object of the present invention is to provide a technique capable of preventing any increase in the standby current flow rat due to hydrogen coming from the outside.

A further object of the present invention is to provide a technique capable of reducing the number of fabrication steps of forming a semiconductor integrated circuit divice having the SRAM and bipolar transistors for achieving the above-specified objects.

The foregoing and other objects and novel features of the present invention will become apparent from the description to be made herein and the accompanying drawings.

The representatives of the inventions to be disclosed hereinafter will be briefly described in the following.

In the memory cell of the SRAM, a conductive layer has its one end connected with the one-side semiconductor regions (i.e., information storage nodes) of the transfer MISFETs within the region, which is defined by the gate electrodes of the transfer MISFETs and the gate electrodes of the driver MISFETs, and its other end connected with the upper surfaces of the gate electrodes of the drive MISFETs.

Moreover, the conductive layer is made integral with the high resistance load elements of the memory cell.

In the SRAM having its data lines extending over the high resistance load elements, furthermore, a plate electrode layer is formed over the conductive layer through a dielectric film, and an electric field shielding layer is formed between the high resistance load elements and the data lines.

Furthermore, an inter-layer insulation film made mainly of a silicon nitride film is formed between the high resistance load elements and the electric field shielding layer.

Furthermore, the plate electrode layer and the electric field shielding layer are formed at a common fabrication step.

In the semiconductor integrated circuit device having the SRAM and the bipolar transistors, furthermore, the step of forming a first connection hole within a region, which is defined by the gate electrodes of the transfer MISFETs and the gate electrodes of the driver MISFETs of the memory cell of the SRAM, and the step of forming a second connection hole within a region, which is defined by the base electrodes of the bipolar transistors, are simultaneously accomplished.

Moreover, the step of connecting the conductive layer with the one-side semiconductor regions of the transfer MISFETs through the first connection hole and the step of connecting the emitter electrodes with the emitter regions through the second connection hole are simultaneously accomplished.

According to the means described above, the one-side semiconductor regions of the transfer MISFETs and the gate electrodes of the driver MISFETs can be connected with the connection area corresponding to the working size between the gate electrodes of the transfer MISFETs and the gate electrodes of the drive MISFETs. As a result, the connection area can be reduced to improve the integration of the SRAM to an extent corresponding to the masking displacement at the fabrication step of the one-side semiconductor regions of the transfer MISFETs and the gate electrodes of the driver MISFETs in case they are to be connected.

Moreover, the connections between the one-side semiconductor regions of the transfer MISFETs and the gate electrodes of the driver MISFETs are accomplished by using the conductive layer made integral with the high resistance load elements so that the number of the conductive layers for the connections will not be increased.

Furthermore, the step of forming the first connection hole of the memory cell of the SRAM can be used commonly with the step of forming the second connection hole of the bipolar transistors so that the number of steps of fabricating the semiconductor integrated circuit device can be reduced by the step of forming the first connection hole.

Furthermore, the step of forming the conductive layer of the memory cell of the SRAM can be used commonly with the step of forming the emitter electrodes of the bipolar transistors so that the number of steps of fabricating the semiconductor integrated circuit device can be reduced by the step of forming the conductive layer.

According to the means described above, the charge storage amount of the information storage nodes can be increased by the capacitance elements which are composed of the aforementioned conductive layer, dielectric film and plate electrode layer so that the software errors due to the alpha rays can be prevented. At the same time, the field effect from the data lines can be shielded to prevent any parasitic channel from being established in the high resistance load elements so that the standby current flow rate can be reduced to reduce the power consumption of the SRAM.

In addition to the above-specified effect, the hydrogen from the outside can be prevented from migrating into the high resistance load elements in the inter-layer insulating film and the plate electrode layer, and the threshold voltage of the parasitic MOS having the high resistance load elements as the channel forming region can be prevented from dropping to reduce the standby current flow rate and accordingly the power consumption of the SRAM.

Since, moreover, the step of forming the electric field shielding layer is shared with the step of forming the plate electrode layer, the number of steps of fabricating the SRAM can be reduced by the step of forming the electric field shielding layer.

BRIEF DESCRIPTION OF THE DRAWINGS

FIGS. 6 to 14 are sections showing the essential portion of the memory cell of the SRAM at the individual fabrication steps;

FIG. 15 is an essential section taken along line XV—XV of FIG. 2; and

FIGS. 16 and 17 are schematic sections showing the structure of the memory cell of a SRAM according to another embodiment of the present invention.

FIGS. 20 and 21 are sections showing the essential portion of the memory cell according to the second embodiment at predetermined fabrication steps;

FIG. 27 is a top plan view showing an essential portion of the memory cell of a SRAM according to a third embodiment of the present invention.

DESCRIPTION OF THE PREFERRED EMBODIMENTS

Figure 1:
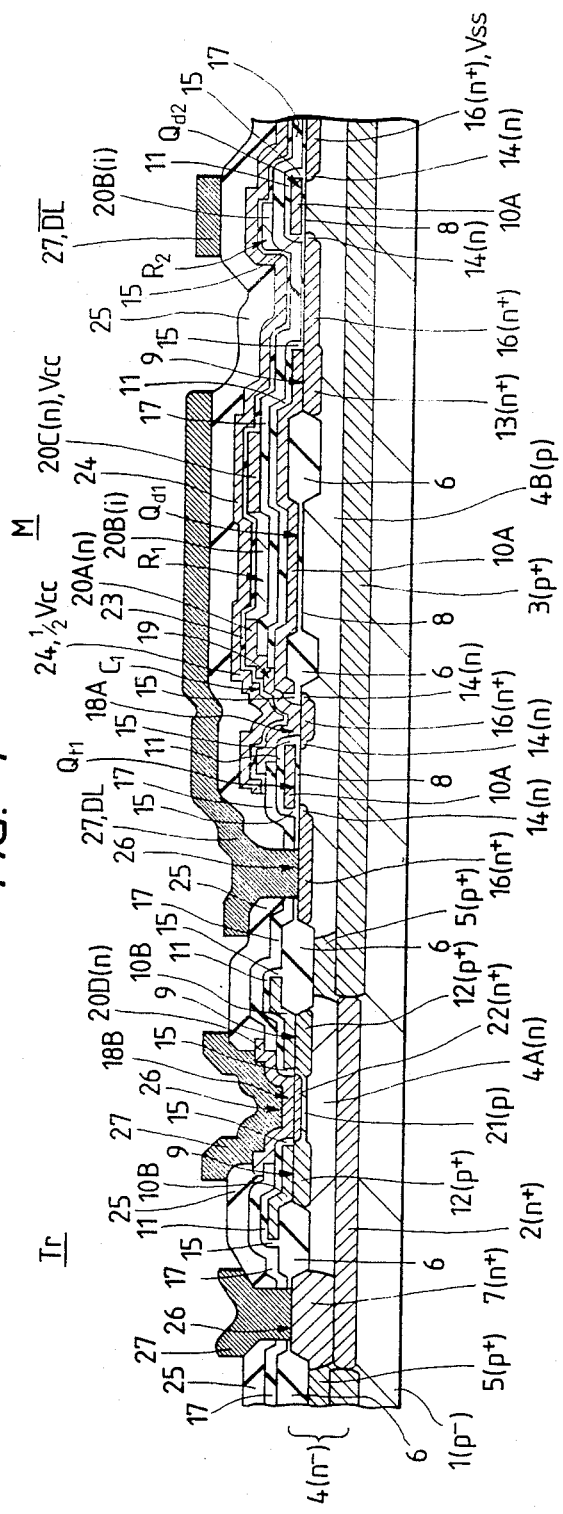
FIG. 1 is a section showing an essential portion of a semiconductor integrated circuit device having the memory cell and bipolar transistor of a SRAM according to a first embodiment of the present invention.

The structure of the present invention will be described in the following in connection with one embodiment thereof, in which the present invention is applied to a mixed type semiconductor integrated circuit (or the so-called "SRAM built-in type BiCMOS") having a SRAM and a bipolar transistor. Incidentally, throughout all Figures for explaining the present invention, portions having common functions are designated at common reference numerals, and their repeated descriptions will be omitted.

FIRST EMBODIMENT

In FIG. 1 (in an essential section), there is a semiconductor integrated circuit device which has the memory cell and bipolar transistor of a SRAM according to one embodiment of the present invention.

The righthand side of FIG. 1 shows the memory cell M of the SRAM, and the lefthand side of FIG. 1 shows the bipolar transistor Tr.

Figure 3:
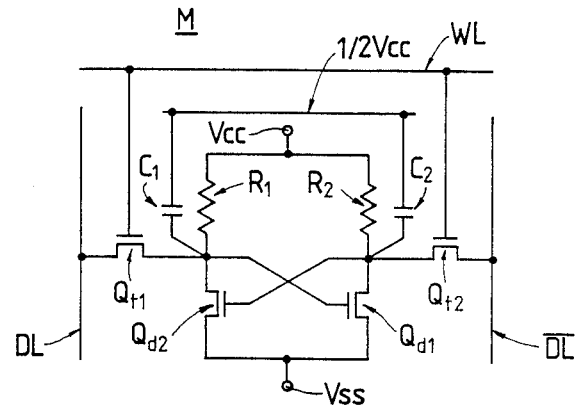
FIG. 3 is a diagram showing an equivalent circuit of the memory cell of the SRAM.

The memory cell M of the SRAM is arranged at the intersections between complementary data lines DL and $\overline{DL}$ and a word line WL, as shown in (an equivalent circuit diagram of) FIG. 3. The complementary data lines DL and $\overline{DL}$ extends in the row direction, and the word line extends in the column direction.

The memory cell is composed of a flip-flop circuit and two transfer MISFETs $Qt_1$ and $Qt_2$ which have their respective one-side semiconductor regions connected with the paired input/output terminals of the flip-flop circuit.

Each of the transfer MISFETs $Qt_1$ and $Qt_2$ is of the n-channel type. The respective other semiconductor regions of the transfer MISFETs $Qt_1$ and $Qt_2$ are connected with the complementary data lines DL and $\overline{DL}$. The respective gate electrodes of the transfer MISFETs $Qt_1$ and $Qt_2$ are connected with the word line WL.

The flip-flop circuit is used as an information storage unit which has its input/output terminals providing information storage nodes. The flip-flop circuit is composed of two driver MISFETs $Qd_1$ and $Qd_2$ and two load elements $R_1$ and $R_2$ of high resistance. The drive MISFETs $Qd_1$ and $Qd_2$ are of the n-channel type.

The driver MISFETs $Qd_1$ and $Qd_2$ have their source regions connected with a reference voltage Vss. This reference voltage Vss is at the ground potential of 0 [V] of the circuit, for example. The driver MISFET $Qd_1$ has its drain region connected with one end of the high resistance load element $R_2$, one semiconductor region of the transfer MISFET $Qt_2$, and the gate electrode of the drive MISFET $Qd_2$. The drive MISFET $Qd_2$ has its drain region connected with the one end of the high resistance load element $R_1$, one semiconductor region of the transfer MISFET $Qt_1$, and the gate electrode of the driver MISFET $Qd_1$. The individual other ends of the high resistance load elements $R_1$ and $R_2$ are connected with a power source voltage Vcc. This power source voltage is at the operating voltage of 5 [V] of the circuit, for example.

With the input/output terminals (or information storage nodes) of the flip-flop circuit, respectively, there are connected capacitance elements $C_1$ and $C_2$. Of these, the capacitance element $C_1$ has its one electrode connected with the drain region (or information storage node) of the drive MISFET $Qd_2$. The other capacitance element $C_2$ its one electrode connected with the drain region (or information storage node) of the drive MISFET $Qd_1$. The individual other electrodes of the capacitance elements $C_1$ and $C_2$ are connected with a power source voltage ½ Vcc, although not limitative thereto. This power source voltage ½ Vcc is at an intermediate voltage (of about 2.5 [V]) between the power source voltage Vcc (of 5 V) and the reference voltage Vss (of 0 V). The capacitance elements $C_1$ and $C_2$ are constructed to increase the charge storages of the information storage nodes.

Next, the concrete structure of the memory cell M of the SRAM thus constructed will be briefly described with reference to FIGS. 1 and 2 (i.e., the top plan views of the memory cell). Incidentally, the memory cell M of the SRAM shown in FIG. 1 is presented in section taken along line I—I of FIG. 2.

Figure 2:
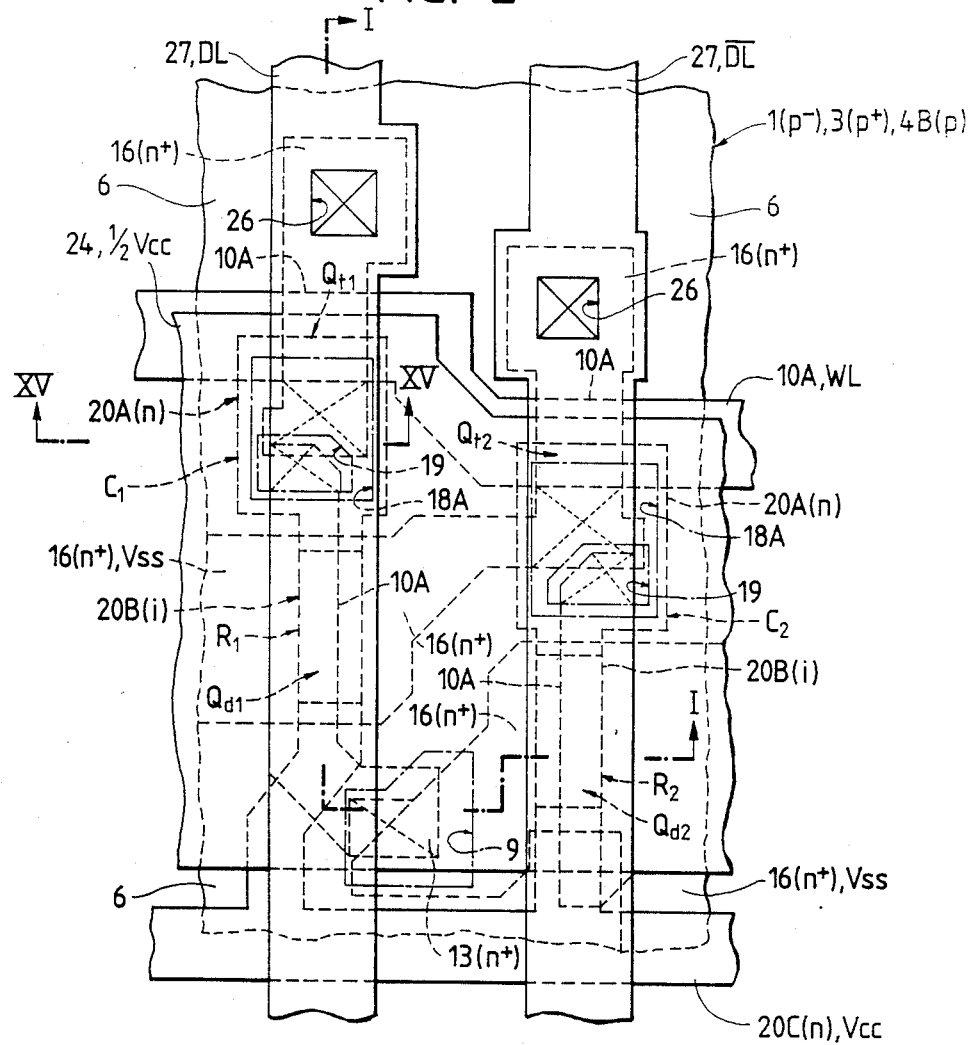
FIG. 2 is a top plan view showing the memory cell of the SRAM.

The memory cell M of the SRAM is constructed in the main surface of a p-type well region 4B, as shown in FIGS. 1 and 2. This well region 4B is formed in the main surface portion of an $n^-$-type epitaxial layer 4 which has been grown over the main surface of a $p^-$-type semiconductor substrate 1 made of single crystal silicon. A $p^+$-type semiconductor region (or the so-called "buried semiconductor region layer) 3 is formed between the semiconductor substrate 1 and the well region 4B.

Between the memory cells M and between the individual elements composing each of the memory cell M, there are formed in the main surface of the well region 4B field insulation films 6 (or inter-element separating insulation films) and not-shown p-type channel stopper regions. These field insulating films 6 and channel stopper regions electrically separate the memory cells M and their individual elements. Moreover, the memory cell M and another element such as the bipolar transistor Tr are electrically separated by the field insulation film 6 and a $p^+$-type semiconductor region 5 formed in the epitaxial layer 4 below the former.

Figure 4:
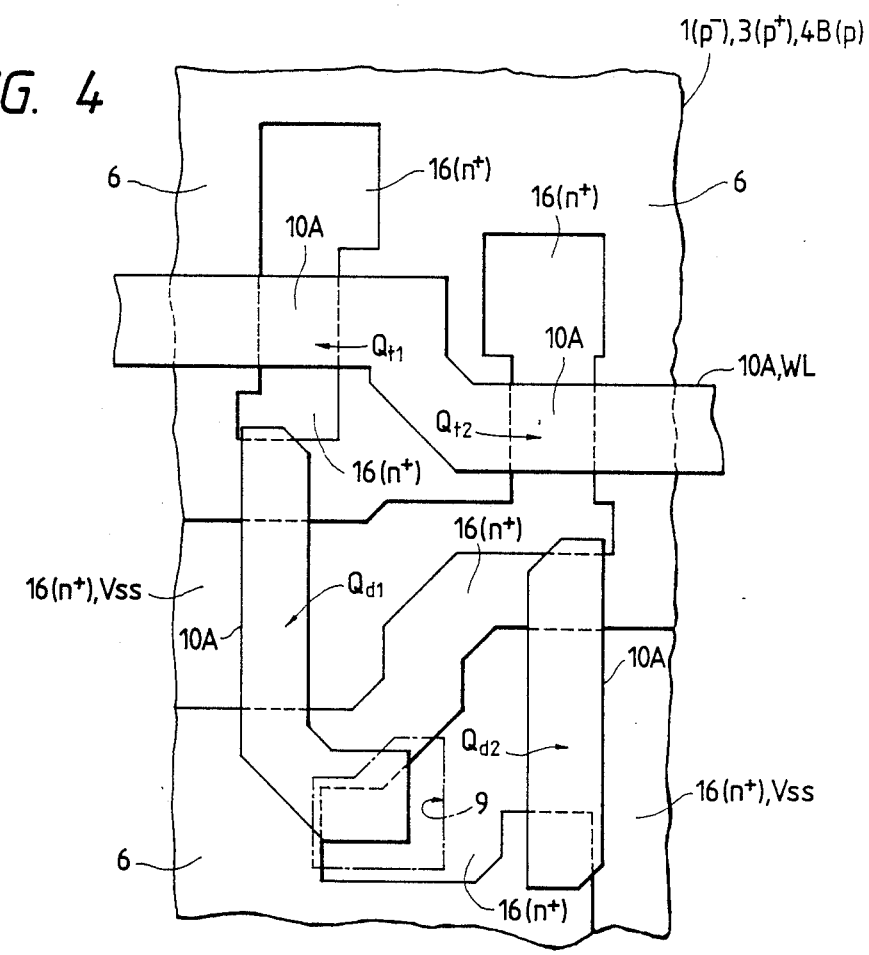
FIGS. 4 and 5 are top plan views showing the memory cell of the SRAM at predetermined fabrication steps.

Each of the transfer MISFETs $Qt_1$ and $Qt_2$ of the memory cell M is formed over the well region 4B, as shown in FIGS. 1, 2 and 4 (in top plan views at predetermined fabrication steps), within the regions enclosed by the field insulation films 6 and the not shown channel stopper regions. Specifically, each of the transfer MISFETs $Qt_1$ and $Qt_2$ is composed majorly of the well region 4B, a gate insulation film 8, a gate electrode 10A, a pair of n-type semiconductor regions 14 providing the source regions and a pair of $n^+$-type semiconductor regions 16 providing the drain regions.

The well region 4B is used as a channel forming region.

The gate insulation film 8 is made of a silicon oxide film which is formed by oxidizing the main surface of the well region 4B.

The gate electrode 10A is formed over a predetermined portion of the gate insulation film 8. The gate electrode 10A is made of a polycrystalline silicon film which is deposited by the CVD of introducing an n-type impurity (e.g., P or As) for reducing the resistance. Alternatively, the gate electrode 10A may be made of a composite film which is formed by laminating either a film of metal silicide of high melting point (e.g., $MoSi_2$, $TaSi_2$, $TiSi_2$ or $WSi_2$) or a film of a metal of high melting point (e.g., Mo, Ta, Ti or W) over the polycrystalline silicon film.

The individual gate electrodes 10A of the transfer MISFETs $Qt_1$ and $Qt_2$ are made integral with the word line (WL) 10A extending in the column direction. These word lines 10A are formed to extend over the field insulation film 6.

The semiconductor regions 14 of low impurity concentration are made integral with the semiconductor regions 16 of high impurity concentration and positioned at the side of the channel forming regions in the main surface of the well region 4B. Thus, the semiconductor regions 14 of low impurity concentration form the transfer MISFETs $Qt_1$ and $Qt_2$ into the so-called "LDD (Lightly Doped -Drain) structure. These lightly doped semiconductor regions 14 ar in self-alignment with respect to the gate electrode 10A.

The highly doped semiconductor regions 16 are in self-alignment with respect to side wall spacers 15 which are formed on the side walls of the gate electrode 10A.

The driver MISFETs $Qd_1$ and $Qd_2$ of the memory cell M are constructed to have structures substantially similar to those of the aforementioned transfer MISFETs $Qt_1$ and $Qt_2$, respectively. Specifically, each of the drive MISFETs $Qd_1$ and $Qd_2$ is composed of the well region 4B, the gate insulation film 8, the gate electrode 10A, the paired n-type semiconductor regions 14 providing the source regions, and the paired $n^+$-type semiconductor regions 16 providing the drain regions. Each of the driver MISFETs $Qd_1$ and $Qd_2$ is constructed to have the LDD structure.

Figure 5:
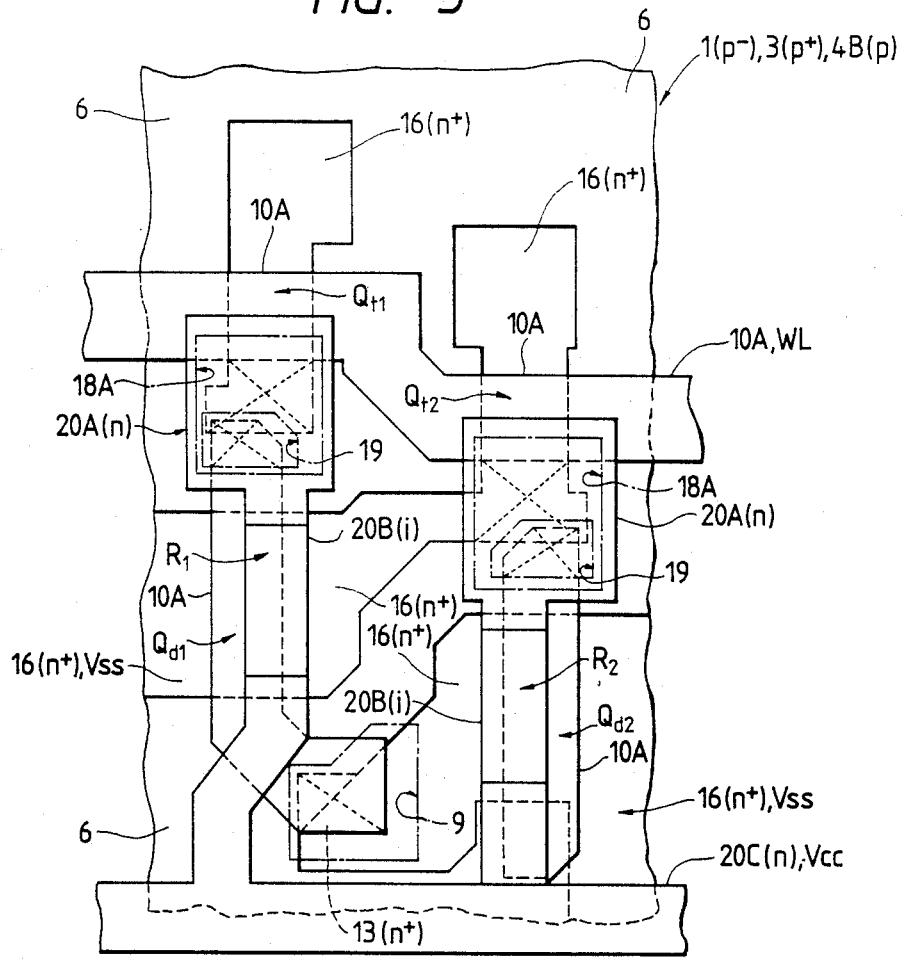

One extending end of the gate electrode 10A of the driver MISFET $Qd_1$ is connected with one semiconductor region 16 of the transfer MISFET $Qt_1$ through an overlying conductive layer 20A, as better seen from FIGS. 1 and 5 (in top plan views at predetermined fabrication steps). Likewise, one extending end of the gate electrode 10A of the driver MISFET $Qd_2$ is connected through the overlying conductive layer 20A with one semiconductor region 16 of the transfer MISFET $Qt_2$. These connected portions correspond to the information storage nodes of the flip-flop circuit of the memory cell M.

The aforementioned conductive layer 20A has its one end connected through a connection hole 18A with the semiconductor region 16 and its other end connected through a connection hole 19 with the gate electrode 10A of the driver MISFET Qd. The connection hole 18A is formed within a region opened into an inter-layer insulation film 17 and within a region defined by the side wall spacers 15 which are formed on the side walls of the respective one-side ends of the gate electrode 10A of the transfer MISFET Qt and the gate electrode 10A of the driver MISFET Qd. The gate electrode 10A of the transfer MISFET Qt and the conductive layer 20A are electrically separated by an inter-layer insulation film 11 which is formed over the gate electrode 10A. Since the side wall spacers 15 on the side walls of the gate electrode 10A can be formed to have a thin film of several thousands [Å] end of the conductive layer 20A can be connected with the semiconductor region 16 with the connection area in the region defined by the working size between the one-side ends of the gate electrode 10A of the transfer MISFET Qt and the gate electrode 10A of the driver MISFET Qd. Moreover, the connected portion between the one end of the conductive layer 20A and the semiconductor region 16 can be formed in self-alignment with the one-side ends of the gate electrode 10A of the transfer MISFET Qt and the gate electrode 10A of the drive MISFET Qd.

The connection hole 19 is formed in the interlayer insulation film 11 of the one end portion of the gate electrode 10A of the driver MISFET Qd within the region opened into the inter-layer insulation film 17 for forming the connection hole 18A. In short, the connection hole 19 is formed over the gate electrode 10A. The connection hole 19 is also formed within the region different from the one end side of the conductive layer 20A and over the field insulating film 6 for separating the transfer MISFET Qt and the driver MISFET Qd. In short, the connection hole 19 will not give rise to the area of the memory cell M because the area therefor is provided by the area for forming the gate electrode 10A or the field insulation film 6.

The conductive layer 20A is made of a polycrystalline silicon which is deposited b the CVD of introducing an n-type impurity (e.g., P or As) for reducing the resistance.

The other end side of the gate electrode 10A of the drive MISFET $Qd_1$ is connected with the semiconductor region 16 providing the drain region of the drive MISFET $Qd_2$ through a connection hole 9, which is formed in the gate insulation film 8, while forming an $n^+$-type semiconductor region 13 in the course thereof. This semiconductor region 13 is formed by diffusing the n-type impurity, which is introduced into the gate electrode (of the polycrystalline silicon film) 10A, into the main surface portion of the well region 4B. This connection is effected by connecting the extending other end portion of the gate electrode 10A directly with the semiconductor region 16 because it establishes the contact with a later-described power source voltage line (Vcc) 20C so that it cannot utilize the same conductive layer as the conductive layer 20A to increase the number of the conductive layers. As a result, the gate electrode 10A of the drive MISFET $Qd_1$ constitutes one of the intersecting lines of the flipflop circuit for effecting the connection between the one semiconductor region 16 of the transfer MISFET $Qt_1$ and the other semiconductor region 16 providing the drain region of the drive MISFET $Qd_2$. The one semiconductor region 16 of the transfer MISFET $Qt_2$ is made integral with the semiconductor region providing the drain region of the drive MISFET $Qd_1$. This integration constitutes the other of the intersecting lines of the flip-flop circuit.

With the respective other semiconductor regions 16 of the transfer MISFETs $Qt_1$ and $Qt_2$, there are connected through connection holes 26 formed in an inter-layer insulation film 25 complementary data lines (DL) 27, which are constructed to extend in the row direction over the inter-layer insulation film 25. The complementary data lines 27 are made of an aluminum film or an aluminum alloy having Cu and/or Si added thereto for preventing the migration.

The semiconductor regions 16 providing the respective source regions of the drive MISFETs $Qd_1$ and $Qd_2$ are supplied with the reference voltage Vss. The supply of this reference voltage Vss is accomplished, although not shown, by the reference wiring lines which are formed in the conductive layers shared with the gate electrode 10A and the word line 10A and and extending in the row direction. These reference voltage wiring lines are connected with through the connection holes 9 formed in the gate insulation film 8 with the semiconductor regions 16 providing the respective source regions of the drive MISFETs $Qd_1$ and $Qd_2$.

The high resistance load element ($R_1$) 20B of the memory cell M is constructed such that the inter-layer insulation film 17 is formed over the drive MISFET $Qd_1$, as shown in FIGS. 1, 2 and 5. The high resistance load element ($R_2$) 20B is constructed over the drive MISFET $Qd_2$. Specifically, the high resistance load element ($R_1$ or $R_2$) 20B is arranged over the gate electrode 10A. The high resistance load element 20B is made of a polycrystalline silicon film which is deposited by the CVD of introducing either none of an impurity for reducing the resistance or a small amount of n- or p-type impurity. The high resistance load element 20B is arranged to share the respective regions of the drive MISFETs $Qd_1$ and $Qd_2$ so that it is featured by capability of reducing the area of the memory cell M.

One end of the high resistance load element ($r_1$) 20B is connected through the conductive layer 20A with the connected portion between one of the semiconductor region 16 of the transfer MISFET $Qt_1$ and the gate electrode 10A of the drive MISFET $Qd_1$. Likewise, one end of the high resistance load element ($R_2$) 20B is connected through the conductive layer 20A with the connected portion between one semiconductor region 16 of the transfer MISFET $Qt_2$ and the gate electrode 10A of the drive MISFET $Qd_2$. The high resistance load element 20B has its one end made integral with the conductive layer 20A. The other end of the high resistance load element 20B is made integral with the power source voltage line (Vcc) 20C. This power source voltage line 20C is formed to extend in the same column direction as the extending direction of the word line 10A. The power source voltage line 20/c is made of a polycrystalline silicon film which is doped with an n-type (or p-type) impurity.

Thus, the semiconductor integrated circuit device has the SRAM composed of the memory cell, in which one of the semiconductor region 16 of the transfer MISFET Qt and the gate electrode 10A of the drive MISFET Qd are connected and in which the high resistance load element R connected with that connected portion through the conductive layer 20A is arranged over the drive MISFET Qd. The conductive layer 20A has its one end connected with the one semiconductor region 16 of the transfer MISFET Qt and its other end connected with the upper surface of the gate electrode 10A of the drive MISFET Qd within the region, which is defined by the gate electrode 10A of the transfer MISFET Qt and the gate electrode 10A of the drive MISFET Qd, in a self-alignment with the respective gate electrodes 10A and separately of the gate electrode 10A of the transfer MISFET Qt. As a result, the one semiconductor region of the transfer MISFET Qt and the gate electrode 10A of the drive MISFET Qd can be connected with the working size between the gate electrode 10A of the transfer MISFET Qt and the gate electrode 10A of the drive MISFET Qd. In case the gate electrode 10A of the drive MISFET Qd is to be connected directly with the one semiconductor region 16 of the transfer MISFET Qt, the connection area can be reduced to improve the degree of integration to an extent corresponding to the masking displacement at the fabrication steps of the two.

Moreover, the connection between the one semiconductor region 16 of the transfer MISFET Qt and the gate electrode 10A of the driver MISFET Qd is effected commonly through the conductive layer 20A for the connection of the high resistance load element R so that the aforementioned conductive layer for the connection is not increased.

A plate electrode layer 24 is formed through a dielectric film 23, as shown in FIGS. 1 and 2, over the conductive layer 20A providing the image storage node of the flip-flop circuit of the aforementioned memory cell M. In other words, the capacitance element $C_1$ is constructed of the conductive layer 20A, which has its one end connected with the connected portion between the one semiconductor region 16 of the transfer MISFET $Qt_1$ and the gate electrode 10A of the driver MISFET $Qd_1$, the dielectric film 23 and the plate electrode layer 24. The capacitance element $C_2$ is constructed of the conductive layer 20A, which has its one end connected with the connected portion between the one semiconductor region 16 of the transfer MISFET $Qt_2$ and the gate electrode 10A of the drive MISFET $Qd_2$, the dielectric film 23 and the plate electrode layer 24.

The dielectric film 23 is formed over the conductive layer 20A and the high resistance load element 20B and below the plate electrode layer 24 and in the same shape. The dielectric film 23 is made of a single layer of a silicon nitride film having a thickness of about 100 to 200 [Å] so as to increase the individual charge storages of the capacitance elements $C_1$ and $C_2$ Alternatively, the dielectric film 23 may be made of a composite film which is formed by laminating a silicon nitride and a silicon oxide film, e.g., by the CVD of oxidizing a film of $Si_3N_4$. In short, the dielectric film 23 is formed of an insulation film which is made mainly of the silicon nitride film.

The plate electrode layer 24 is formed over the dielectric film 23. The plate electrode layer 24 is made integral with such a plate electrode 24 of another memory cell M as is arranged in the same row direction as the extending direction of the word line 10A. The plate electrode layer 24 is supplied with the power source voltage ½ Vcc, as has been described hereinbefore. This voltage supply is intended to minimize the voltage to be applied to the capacitor because the potential at the information storage node fluctuates between the power source voltage and the ground potential. The plate electrode layer 24 is made of a polycrystalline silicon film which is deposited by the CVD, for example.

Over the high resistance load element ($R_1$ or $R_2$), there is formed the electric field shielding layer 24 through the dielectric film 23 acting as the interlayer insulation film 23. The electric field shielding layer 24 is formed between the high resistance load element 20B and the complementary data line 27. This electric field shielding layer 24 is constructed to prevent any parasitic channel from being formed in the high resistance load element 20B by the field effect of the complementary data line 27. In short, the field shielding layer 24 is constructed to prevent the parasitic MOS effect. The parasitic MOS is composed of the complementary data line 27 acting as its gate electrode, the inter-layer insulation film 25 as its gate insulation film, and the high resistance load element 20B as its channel forming region.

This electric field shielding layer 24 is integrally made of the same conductive layer as the aforementioned plate electrode layer 24. Specifically, the electric field shielding layer 24 is formed by extending the plate electrode layer 24 over the conductive layer 20A to over the high resistance load element 20B. As a result, the electric field shielding layer 24 is made of a polycrystalline silicon film and is supplied with the power source voltage ½ Vcc.

Thus, the semiconductor integrated circuit device has the SRAM in which the memory cell M is constructed to connect the high resistance load element ($R_1$ or $R_2$) with the information storage node of the flip-flop circuit through the conductive layer 20A and in which the complementary data line 27 extends over the high resistance load element 20B of the memory cell M. The capacitance element C is constructed by forming the plate electrode layer 24, which is to be supplied with the predetermined potential through the dielectric film 23, over the conductive layer 20A connected with the information storage node, and the electric field shielding layer 24 for shielding the field effect from the complementary data line 27 is formed between the high resistance load element 20B and the complementary data line 27. As a result, the charge storage of the information storage node can be increased to prevent the software error, and the field effect from the complementary data line 27 can be shielded to prevent the parasitic channel from being formed in the high resistance load element 20B. Thus, it is possible to reduce the standby current flow rate and accordingly the power consumption.

By interposing the inter-layer insulation film 23 made mainly of the silicon nitride film between the high resistance load element 20B and the electric field shielding layer 24, moreover, it is possible in addition to the above-specified effects to prevent hydrogen in the inter-layer insulating film 23 from migrating into the high resistance load element 20B, to prevent the crystal properties of the high resistance load element (of the polycrystalline silicon film) 20B from being improved, and to prevent the threshold voltage of the parasitic MOS using the high resistance load element 20B as the channel forming region from being dropped. As a result, the standby current flow can be dropped to reduce the power consumption. Since, moreover, the high resistance load element 20B and the electric field shielding layer 24 are laid out in the direction of the data lines, i.e, the gate of the drive MOS, the high resistance load element and the electric field shielding layer 24 are laid out in the direction perpendicular to the word lines, they do not operate in the direction to emphasize the steps with respect to the wiring lines of the overlying layer.

Incidentally, although not shown in FIG. 1, a passivation film is formed all over the surface of the substrate and over the complementary data line 27. This passivation film is formed of a silicon nitride film which is deposited by the plasma CVD, for example. This passivation film is a source for generating the aforementioned hydrogen.

The bipolar transistor Tr is constructed in the main surface of an n-type well region 4A, as shown at the lefthand side of FIG. 1. The well region 4A is formed in the main surface portion of the epitaxial layer 4 (or formed of the epitaxial layer 4 itself). Between the semiconductor substrate 1 and the well region 4A, there is formed an $n^+$-type semiconductor region (or a buried semiconductor region layer) 2. This semiconductor region 2 is formed to reduce the collector resistance of the bipolar transistor Tr.

The field insulation film 6 and the semiconductor region 5 are interposed between the bipolar transistors Tr to electrically separate the bipolar transistors Tr. Each of the bipolar transistors Tr is constructed of the npn type having a collector region, a base region and an emitter region.

The collector region is composed of the well region 4A a potential raising $n^+$-type semiconductor region 7 and the buried semiconductor region 2. The potential raising semiconductor region 7 is formed in the main surface portion of the well region 4A such that it extends from the main surface of the well region 4A to the buried semiconductor region 2. The collector wiring line 27 is connected with the semiconductor region 7 through the connection hole 26 formed in the inter-layer insulation film 25.

The base region is constructed of a $p^+$-type semiconductor region 12 acting as an external base region and a p-type semiconductor region 21 acting as an activating base region. The semiconductor region 12 as the external base region is formed in a ring shape defined by the field insulation film 6. The semiconductor region 21 as the activating base region is formed at the central portion of the semiconductor region 12 acting as the external base region.

A base electrode 10B is connected through the connection hole 9 with the base region. The base electrode 10B is constructed by introducing a p-type impurity (e.g., B or $BF_2$) into the polycrystalline silicon film which is made of the same conductive layer as the aforementioned gate electrode 10A. The semiconductor region 12 as the external base region is formed by diffusing the p-type impurity, which is introduced into the base electrode 10B, into the main surface portion of the well region 4A. In short, the semiconductor region 12 as the external base region is constructed in self-alignment with the base electrode 10B. With the base electrode 20B, although not shown, there is connected the base wiring line which is made of the same conductive layer as the collector wiring layer 27.

The emitter region is made of an $n^+$-type semiconductor region 22. This semiconductor region 22 is formed in the main surface portion of the semiconductor region acting as the aforementioned activating base region. An emitter electrode 20D is connected with the emitter region through a connection hole 18B. This connection hole 18B is formed in an opening formed in the inter-layer insulation film 17 and within the region which is defined by the side wall spacers 15 formed on the side walls of the base electrode 10B. In short, the connection hole 18B is constructed to have substantially the same structure as that of the connection hole 18A formed in the memory cell M of the aforementioned SRAM. The emitter electrode 20D is made of a polycrystalline silicon film which is formed of the same conductive layer of each of the conductive layer 20A, high resistance load element 20B and power source voltage line 20C of the memory cell M of the SRAM and which is doped with an n-type impurity and a p-type impurity having a lower concentration than that of the former n-type impurity. The emitter region (i.e., the semiconductor region 22) is formed in the main surface portion of the semiconductor region 21 by subjecting the n-type impurity (e.g., As or P), which is introduced into the polycrystalline silicon film of the emitter electrode 20D, to a heat treatment. On the other hand, the esmiconductor region 21 as the activating base region can be formed by a similar method. The emitter wiring line 27 is connected with the emitter electrode 20D through the connection hole 26 formed in the inter-layer insulation film 25.

Next, a concrete method of fabricating the aforementioned semiconductor integrated circuit device will be briefly described with reference to FIGS. 6 to 14 (in sections showing the essential portion as the individual fabrication steps).

First of all, there is prepared the p$^-$-type semiconductor substrate 1 which is made of single crystal silicon.

Next, in the region to be formed with the bipolar transistor Tr, an n-type impurity is introduced into the main surface portion of the semiconductor substrate 1. In the region to be formed with the memory cell M of the SRAM and in the inter-element separating region, a p-type impurity is introduced into the main surface portion of the semiconductor substrate 1. These impurities form the buried semiconductor region layer.

Next, the n$^-$-type epitaxial layer 4 is grown over the main surface of the semiconductor substrate 1. At the same fabrication step as that step for forming the epitaxial layer 4, the individual n-type and p-type impurities introduced are expanded and diffused to form the n$^+$-type semiconductor region 2 and the p$^+$-type semiconductor region 3, respectively, at the interfaces between the semiconductor substrate 1 and the epitaxial layer 4.

Next, as shown in FIG. 6, there are formed in the main surface of the epitaxial layer 4 the n-type well region 4A, the p-type well region 4B, the p$^+$-type semiconductor region 5 and the field insulation film 6. The well region 4A is formed in the regions to be formed with the bipolar transistor Tr and the not-shown p-channel MISFET. The well region 4B is formed the regions to be formed with the memory cell M and the not-shown n-channel MISFET. The semiconductor region 5 is formed mainly between the regions to be formed with the bipolar transistors Tr. The field insulation film 6 is formed between the individual elements.

In the main surface portion of the well region 4B, moreover, the p-type channel stopper region is formed below the field insulation film 6. Incidentally, the aforementioned inter-element separating region may be made of the p-type well region 4B and the p-type channel stopper region in place of the p$^+$-type semiconductor region 5.

Next, the potential raising n$^+$-type semiconductor region 7 is formed in the region to be formed with the bipolar transistor Tr.

Next, as shown in FIG. 7, the gate insulation film 8 is formed over the main surface of the well region 4B. This gate insulation film 8 is likewise formed over the main surface of the well region 4A. The gate insulation film 8 is made of a silicon oxide film by oxidizing the main surface of the well region 4B (or 4A), for example, to have a thickness of about 100 to 300 [Å].

Figure 8:
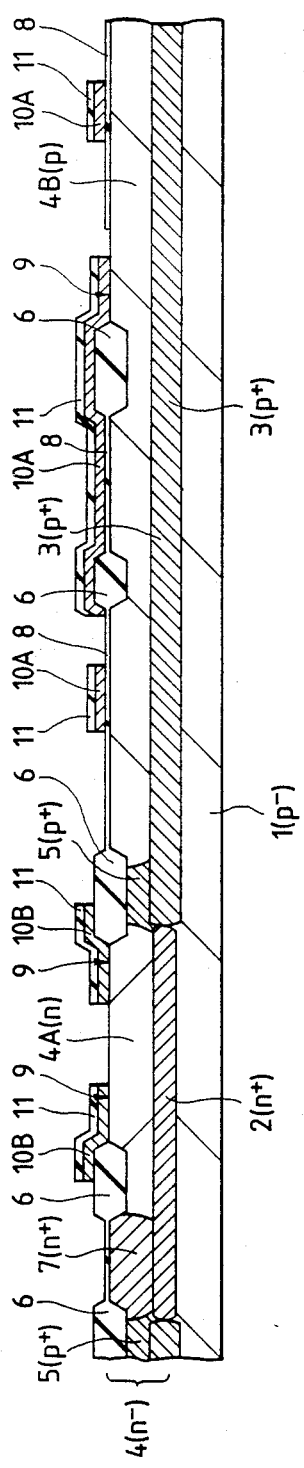

Next, as shown in FIG. 8, the gate electrode 10A and the inter-layer insulation film 11 are formed in the region to be formed with the memory cell M, and the base electrode 10B and the inter-layer insulation film 11 are formed in the region to be formed with the bipolar transistor Tr.

The gate electrode 10A is made of a polycrystalline silicon film which is deposited by the CVD over a predetermined portion of the gate insulation film 8. An n-type impurity such as P is introduced into the polycrytalline silicon film. The gate electrode 10A is formed to have a film thickness of about 3,000 to 4,000 [Å].

The other end of the gate electrode 10A of the drive MISFET Qd$_1$ is connected directly with the main surface of the well region 4B through the connection hole 9 formed in the gate insulation film 8.

The inter-layer insulation film 11 is made of a silicon oxide film, which is deposited by the CVD, for example, to have a thickness of about 3,000 to 4,000 [Å] so as to electrically separate the gate electrode 10A and the overlying conductive layer. The interlayer insulation film 11 is patterned with the gate electrode 10A by an anisotropic etching process such as the RIE.

The base electrode 10B is formed by introducing a p-type impurity such as BF$_2$ into the polycrystalline silicon film which is deposited at the same fabrication step as that of the gate electrode 10A. The base electrode 10B is connected directly with the main surface of the well region 4A through the connection hole 9 which is formed by eliminating the gate insulation film 8. The inter-layer insulation film 11 over the base electrode 10B is formed at the same fabrication step as that of the inter-layer insulation film 11 over the gate electrode 10A.

Figure 9:
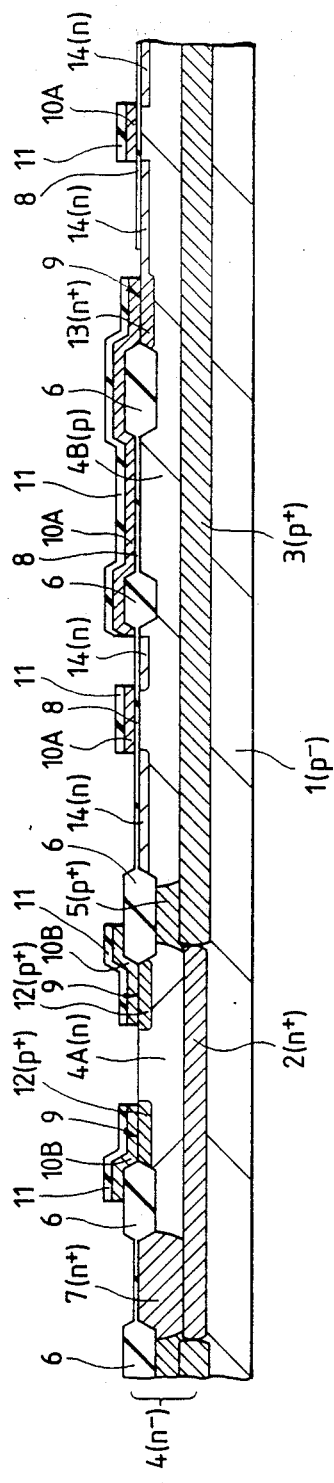

Next, as shown in FIG. 9, in the region to be formed with the memory cell m, the n-type semiconductor region 14 is formed in the main surface of the well region 4B. The n-type semiconductor region 14 is formed by introducing an n-type impurity such as P into the main surface portion of the well region 4B by the ion implantation. Upon the introduction of the n-type impurity, the gate electrode 10A and the inter-layer insulation film 11 are mainly used as an impurity introducing mask. As a result, the semiconductor region 14 is formed in self-alignment with the gate electrode 10A.

At the same fabrication step as the heat treatment step forming part of the step of forming the semiconductor region 14, the n$^+$-type semiconductor region 13 is formed in the main surface of the well region 4B in the region to be formed with the memory cell M, and the p$^+$-type semiconductor region 12 for providing the external base region is formed in the region to be formed with the bipolar transistor Tr. The semiconductor 13 is formed by diffusing the n-type impurity introduced into the gate electrode 10A. The semiconductor 12 is formed by diffusing the p-type impurity introduced into the base electrode 10B.

Figure 10:
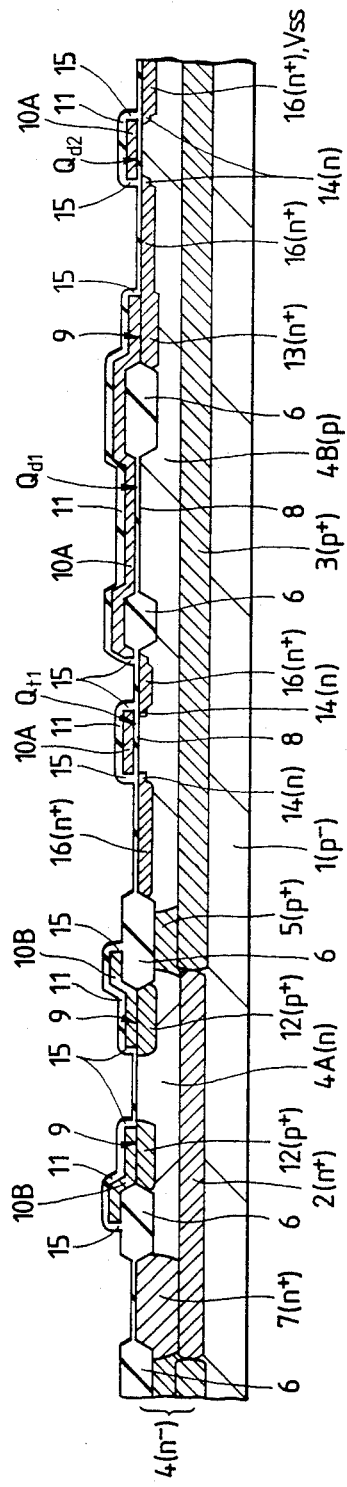

Next, as shown in FIG. 10, the side wall spacers 15 are formed on the side walls of the gate electrode 10A and the side walls of the base electrode 10B. The side wall spacers 15 can be formed by forming an silicon oxide film deposited by the CVD all over the surface of the substrate and over the inter-layer insulation film 11 and by anisotropically etching the silicon oxide film by the RIE or the like. These side wall spacers 15 can be formed to have a small film thickness of about several thousands [Å] from the side walls of the gate electrode 10A and the base electrode 10B. The side wall spacers 15 are formed in self-alignment with the gate electrode 10A or the base electrode 10B.

Next, in the region to be formed with the memory cell M, the n+-type semiconductor region 16 is formed in the main surface portion of the well region 4B. The semiconductor region 16 is formed by introducing a n-type impurity such as As into the main surface portion of the well region 4B by the ion implantation. Upon the introduction of the n-type impurity, the interlayer insulation film 11 and the side wall spacers 15 are used as the impurity introducing mask. As a result, the semiconductor region 16 is formed in self-alignment with the gate electrode 10A.

At the step of forming this semiconductor region 16, the transfer MISFETs $Qt_1$ and $Qt_2$ and the drive MISFETs $Qd_1$ and $Qd_2$ of the memory cell M are completed.

Next, the inter-layer insulation film 17 is formed all over the surface of the substrate and over the aforementioned inter-layer insulation film 11. The inter-layer insulation film 17 is formed of a silicon oxide film, which is deposited by the CVD, for example, to have a thickness of about 2,000 to 3,000 [Å].

Figure 11:
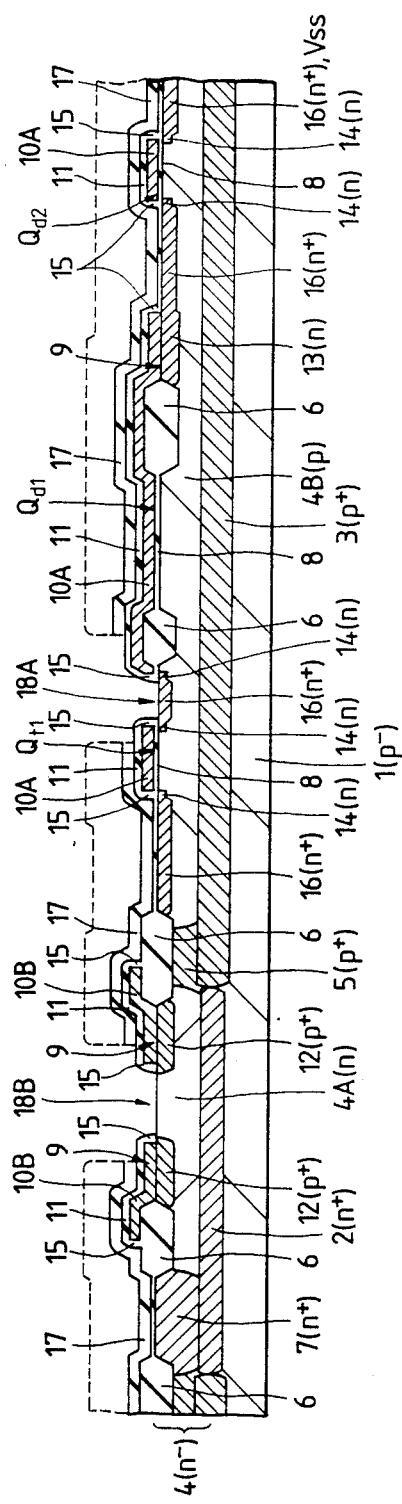

Next, the connection holes 18A and 18B are formed, as shown in FIG. 11. The connection hole 18A is formed by removing the inside of the region, which is defined by the gate electrode 10A of the transfer MISFET Qt and the gate electrode 10A of the drive MISFET Qd, and the inter-layer insulation film 17 over the predetermined portion of the gate electrode 10A of the drive MISFET Qd. This connection hole 18A is formed to expose the main surface of the semiconductor regions 16 acting as the one-side semiconductor regions of the transfer MISFETs $Qt_1$ and $Qt_2$ to the outside within the region defined by the opening formed in the inter-layer insulation film 17 and the side wall spacers 15. The connection hole 18A is formed by using an etching mask made of a photo resist, as indicated by broken lines in FIG. 11. The size of the opening formed in the inter-layer insulation film 17 for forming the connection hole 18A is made larger by at least an extent corresponding to the masking displacement at the fabrication step than the size of the region defined by the gate electrode 10A (i.e., the side wall spacers 15) and the predetermined size (i.e., the size of the connection hole 19) of the gate electrode 10A. When the connection hole 18A is to be formed, moreover, the inter-layer insulation film 11 over the gate electrode 10A is not substantially removed.

The aforementioned connection hole 18B is formed by removing the inter-layer insulation film 17 within the region defined by the base electrode 10B. The connection hole 18B exposes the main surface of the well region 4A to the outside through the opening formed in the inter-layer insulation film 17 and within the region defined by the side wall spacers 15. The size of the connection hole 18B is made larger by at least an extent corresponding to the masking displacement at the fabrication step than the size of the region defined by the side wall spacers 15. The connection hole 18B is formed at the fabrication step shared with that for the aforementioned connection hole 18A.

Figure 12:
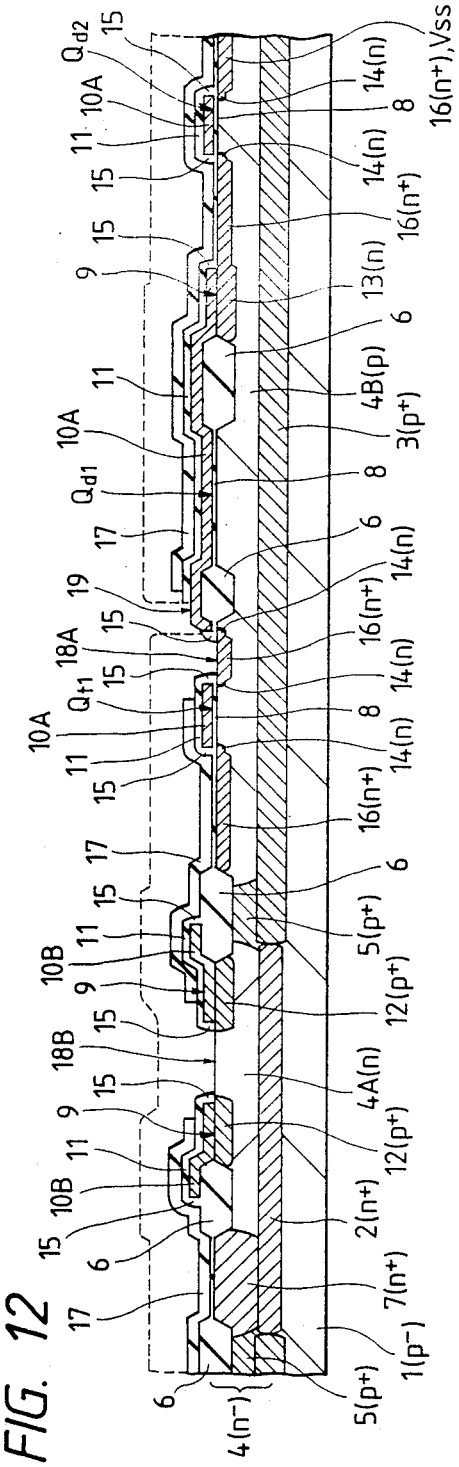

Next, as shown in FIG. 12, in the region opened into the inter-layer insulation film 17 for forming the connection hole 18A, the inter-layer insulation film 11 over the respective gate electrodes 10A of the drive MISFETs $Qd_1$ and $Qd_2$ is removed to form the connection hole 19. This connection hole 19 is formed by using an etching mask, as indicated by broken lines in FIG. 12.

Figure 13:
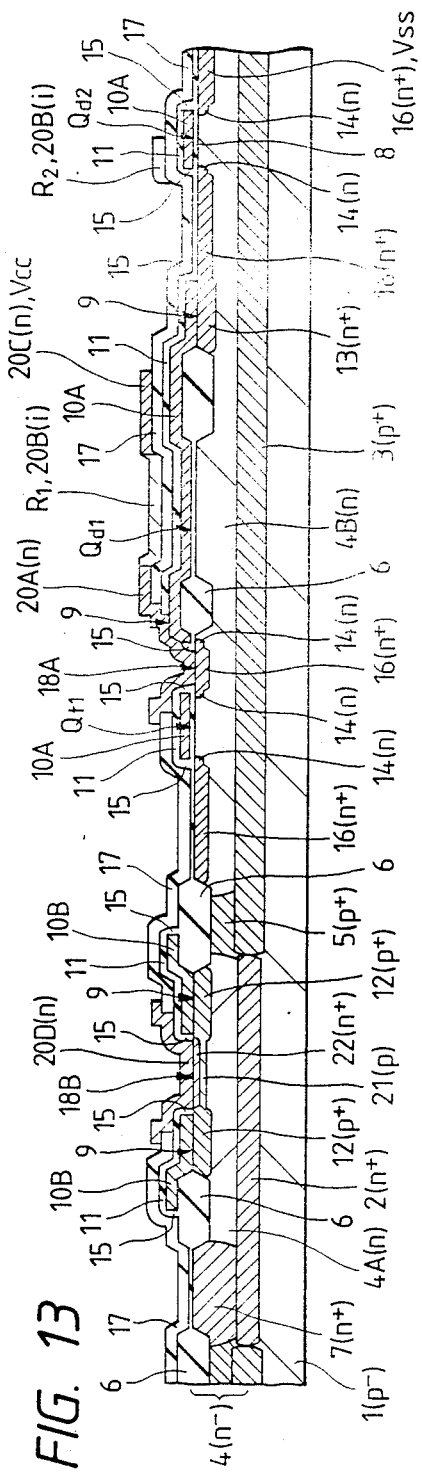

Next, as shown in FIG. 13, the high resistance load elements ($R_1$ and $R_2$) and the power source voltage line 20C are formed in the region to be formed with the memory cell M, and the emitter electrode 20D is formed in the region to be formed with the bipolar transistor Tr.

The conductive layer 20A is formed over the inter-layer insulation film 17 to have its one end connected through the connection hole 18A with the respective one-side semiconductor regions 16 of the transfer MISFETs $Qt_1$ and $Qt_2$ and its other end connected through the connection hole 19 with surfaces of the respective gate electrodes 10A of the drive MISFETs $Qd_1$ and $Qd_2$. The conductive layer 20A is formed of a polycrystalline silicon film doped with an n-type impurity (e.g., P), for example, to have a thickness of about 2,000 to 3,000 [Å].

The high resistance load element 20B has its one end made integral with the other end of the aforementioned conductive layer 20A and its other end made integral with the power source voltage line 20C. In short, the high resistance load element 20B formed at the fabrication step shared with the conductive layer 20A. The high resistance load element 20B is made of an i-type polycrystalline silicon film which is either undoped or doped with a small amount of n- or p-type impurity.

The power source voltage line 20C is made of a polycrystalline silicon film doped with an n-type impurity at the fabrication step shared with the conductive layer 20A.

The aforementioned emitter electrode 20D is formed over the inter-layer insulation film 17 such that it is connected directly with the main surface of the well region 4A through the connection hole 18B. The emitter electrode 20D is made of an n-type polycrystalline silicon film formed at the fabrication step shared with the foregoing conductive layer 20A and the power source voltage line 20C. In the main surface portion of the well region 4A below that emitter electrode 20D, as shown in FIG. 13, the p-type semiconductor region 21 for providing the activating base region and the n+-type semiconductor region 22 for providing the emitter region are formed by depositing a polycrystalline silicon film by the CVD, by introducing n- and p-type impurities into the polycrystalline silicon film and by subjecting it to a heat treatment.

Specifically, the semiconductor region 21 is made of diffusing thereinto the p-type impurity such as boron (B) which has been introduced into the polycrystalline silicon film of the emitter electrode 20D. On the other hand, the semiconductor region 22 is formed by diffusing thereinto the n-type impurity such as arsenic (As) which has been introduced into the polycrystalline silicon film of the emitter electrode 20D. Since the diffusion coefficient of the boron (B) in the subsrate is larger than that of the arsenic (As), the semiconductor region 21 is formed in a deeper position of the substrate than the semiconductor region 22. Since the concentration of the arsenic (As) is sufficiently higher than that of the boron (B), the semiconductor region 22 and the polycrystalline silicon film of the emitter electrode 20D exhibit the n-type. The bipolar transistor Tr is completed by forming the aforementioned emitter electrode 20D and semiconductor regions 21 and 22.

Thus, there is fabricated the semiconductor integrated circuit device comprising; the SRAM constructed of the memory cell M, in which the one semiconductor region 16 of the transfer MISFET Qt and the gate electrode 10A of the drive MISFET Qd are connected and in which the high resistance load elements ($R_1$ or $R_2O$ connected through the conductive layer 20A with that connected portion is arranged over the drive MISFET Qd; and the bipolar transistor Tr, in which the emitter electrode 20D is connected with the inside of the region defined by the base electrode. This semiconductor integrated circuit device is fabricated by the process comprising: the step of forming the gate electrode 10A of the transfer MISFET Qt and the gate electrode 10A of the drive MISFET Qd of the memory cell M of the SRAM and the base electrode 10B of the bipolar transistor Tr and forming the inter-layer insulation film 11 (i.e., a first insulation film) over the gate electrodes 10A and the base electrode 10B; the step of forming the side wall spacers 15 on the individual side walls of the gate electrodes 10A and the base electrode 10B; the step of forming the inter-layer insulation film 17 (i.e., a second insulation film) all over the surface of the substrate and over the inter-layer insulation film 11; the step of forming the connection hole 18A (i.e., a first connection hole) defined by the inter-layer insulation film 17 and the side wall spacers 15 by removing the inside of the region, which is defined by the gate electrode 10A of the transfer MISFET Qt and the gate electrode 10A of the drive MISFET Qd, and the inter-layer insulation film 17 over a predetermined portion of the gate electrode 10A of the drive MISFET Qd and forming the connection hole 18B (i.e., a second connection hole) defined by the interlayer insulation film 17 and the side wall spacers 15 by removing the inter-layer insulation film 17 inside of the region defined by the base electrode 10B; the step of forming the connection hole 19 (i.e., a third connection hole) by removing the inter-layer insulation film 11 over a predetermined portion of the gate electrode 10A of the drive MISFET Qd in the connection hole 18A; and the step of forming over the inter-layer insulation film 17 the conductive layer 20A, which has its one end connected with the one semiconductor region 16 of the transfer MISFET Qt through the connection hole 18A and its other end connected with the gate electrode 10A of the drive MISFET Qd through the connection hole 19, the high resistance load element 20B made integral with the conductive layer 20A and forming over the inter-layer insulation film 17 the emitter electrode 20D connected with the well region 4A (i.e., the emitter region) through the connection hole 18B. As a result, the step of forming the connection hole 18A of the memory cell M of the SRAM can be shared with the step of forming the connection hole 18B of the bipolar transistor Tr so that the number of fabrication steps of fabricating the semiconductor integrated circuit device can be reduced by an extent corresponding to the step of forming the connection hole 18A.

Moreover, the step of forming the conductive layer 20A and high resistance load element 20B of the memory cell M of the SRAM can be shared with the step of forming the emitter electrode 20D of the bipolar transistor Tr so that the number of fabrication steps of fabricating the semiconductor integrated circuit device can be reduced by an extent corresponding to the step of forming the conductive layer 20A and the high resistance load element 20B.

Next, as shown in FIG. 14, in the region to be formed with the memory cell M, the plate electrode layer 24 is formed over the conductive layer 20a through the dielectric film 23 to form the capacity elements $C_1$ and $C_2$. At the same fabrication step as that of forming the capacity element C, the electric field shielding layer 24 is formed over each of the high resistance load element ($R_1$ and $R_2$) through the dielectric film 23 acting as the inter-layer insulation film 23.

The dielectric film 23 and the inter-layer insulation film 23 are formed at the common fabrication step. The dielectric film 23 is made of a single-layered silicon nitride film, which is deposited by the CVD, for example, so as to improve the dielectric coefficient and is made to have a thickness of about 100 to 200 [Å]. The dielectric film 23 and the interlayer insulation film 23 are patterned by using the plate electrode layer 24 and the electric field shielding layer 24 as the etching mask. Alternatively, the dielectric film 23 and the inter-layer insulation film 23 may be made of a two-layered film of $SiO_2/Si_3N_4$ which is formed by oxidizing a silicon nitride film deposited by the CVD.

The aforementioned plate electrode 24 and electric field shielding layer 24 are formed at the common fabrication step. The plate electrode layer 24 and the electric field shielding layer 24 are formed of a polycrystalline silicon film deposited by the CVD, for example, to have a thickness of about 1,500 to 3,000 [Å]. This polycrystalline silicon film is doped with an n-type impurity.

Next, the inter-layer insulation film 25 is formed all over the substrate including the plate electrode 24 and the field effect shielding layer 24. The interlayer insulation film 25 is made of a composite film in which a BPSG film having a thickness of about 4,000 to 6,000 [Å] deposited by the CVD is laminated over a silicon oxide film having a thickness of about 100 to 500 [Å] deposited by the CVD, for example. The BPSG film softens the step shape resulting from the multilayered wiring structure to improve the step coverage of the upper layer line. The silicon oxide film is formed to prevent the leakage of B or P from the BPSG film.

Next, the connection hole 26 is formed by removing the inter-layer insulation film 25 and so on lying over the other semiconductor regions 16 of the transfer MISFETs $Qt_1$ and $Qt_2$ of the memory cell M, the semiconductor region 7 for raising the potential of the bipolar transistor Tr and the emitter electrode 20D.

Next, as shown in FIGS. 1 and 2, the complementary data lines (DL) 27, the collector wiring line 27, the emitter wiring line 27 and the base wiring line are formed over the inter-layer insulation film 25. These wiring lines 27 are connected through the connection hole 26 with the individual regions.

Next, although not shown, the passivation film is formed all over the surface of the substrate including the wiring lines 27. The passivation film is made of a silicon nitride film deposited by the plasma CVD.

The semiconductor integrated circuit device of the present embodiment is completed by a series of those fabrication steps.

Thus, there is fabricated the semiconductor integrated circuit device comprising the SRAM which has the memory cell M connecting the high resistance load elements ($R_1$ and $R_2$) with the information storage nodes of the flip-flop circuit and in which the complementary data lines 27 extend over the high resistance load element 20B of the memory cell M. At the same fabrication step as the step of forming the capacity element C by forming the plate electrode layer 24, which is to be supplied with a predetermined potential through the dielectric film 23, over the conductive layer 20A to be connected with the storage nodes, the electric field shielding layer 24 for shielding the field effect from the complementary data lines 27 is formed between the high resistance complementary load element 208 and the complementary data lines 27 so that the step of forming the plate electrode layer 24 can be shared with the step of forming the electric field shielding layer 24. As a result, the number of fabrication steps of the semiconductor integrated circuit device can be reduced by an extent corresponding to the step of forming the electric field shielding layer 24.

At the same step as the step of forming the dielectric film 23 over the conductive layer 20A, moreover, the step of forming the inter-layer insulation film 23 can be shared with the step of forming the dielectric film 23 so that the number of fabrication steps of the semiconductor integrated circuit device can be reduced by an extent corresponding to the step of forming the inter-layer insulation film 23.

As shown in FIG. 15 (in section showing an essential portion and taken along line XV—XV of FIG. 2), on the other hand, a high breakdown voltage is set between the respective transfer MISFETs $Qt_1$ and $Qt_1$, and $Qt_2$ and $Qt_2$ of the two memory cells M adjoining in the row direction of the SRAM. Specifically, the individual one-side semiconductor regions 16 of the transfer MISFETs $Qt_1$ and $Qt_2$ are made of an n-type impurity introduced by the ion implantation but not by the thermal diffusion like the semiconductor region 13 forming part of the drain region of the drive MISFET $Qd_2$ so that the pn junction of the semiconductor regions 16 can be made shallow to reduce the run-around of the semiconductor regions 16 below the field insulation layer 6. As a result, the size of the clearance between the memory cells M adjoining in the row direction can be reduced to better improve the integration of the SRAM.

As shown in FIGS. 16 and 17 (in schematic section showing the high resistance load element and capacity element portions of the memory cell), on the other hand, the inter-layer insulation film 23 having a larger thickness than that of the dielectric film 23 may be formed between the high resistance load elements ($R_1$ and $R_2$) and electric field shielding layer 24 of the memory cell M of the SRAM. The inter-layer insulation film 23 is made of a composite film in which a silicon nitride film 23A and a silicon oxide film 23B formed at the same fabrication step as that of the dielectric film 23 are laminated. The inter-layer insulation film 23 thus made reduces the parasitic capacity to be added to the high resistance load element 20B and the power source voltage line 20C and to improve the breakdown voltage between each of the high resistance load element 20B and the power source voltage line 20C and the electric field insulating layer 24.

Although our invention has been thus far described specifically in connection the foregoing embodiments, it should not be limited to those embodiments but can naturally be modified in various manners without departing from the gist thereof.

The effects to be obtained from the representative of the invention to be disclosed herein will be briefly described in the following.

In the semiconductor integrated circuit device having the SRAM, the area of the memory cell of the SRAM can be reduced to improve the integration.

In addition to this effect, the number of the conductive layers over the memory cell can be reduced.

In the semiconductor integrated circuit device having the SRAM and the bipolar transistor, moreover, the number of steps for attaining the above-specified effects can be reduced.

In the semiconductor integrated circuit device having the SRAM, furthermore, it is possible to prevent any software error and to reduce the power consumption.

In addition to the above-specified effects, the reduction in the threshold voltage of the parasitic MOS using the high resistance load element as the channel forming region, which might otherwise be caused by the migration of hydrogen from the outside into the high resistance load element, can be prevented to further reduce the power consumption of the SRAM.

Furthermore, the number of fabrication steps for attaining those effects can be reduced.

SECOND EMBODIMENT

We have the following problems caused in the SRAM of the foregoing first embodiment.

In order to retain a sufficient charge storage in the fine area restricted in the memory cell, the dielectric film of the capacitance element is made of a thin film having a thickness of several hundreds $|Å|$. The dielectric film is made of either: a single layer of a silicon silicide film or a silicon nitride film for increasing the charge storage; or a composite film made mainly of the single layer. On the other hand, the plate electrode layer acting as the other electrode of the capacitance element cannot be formed all over the surface of the memory cell. In other words, first of all, the plate electrode layer has to be formed in the region excepting the power source voltage line so as to prevent the operating speed from being dropped as a result of the acceleration of the parasitic capacitance. Moreover, the plate electrode layer is formed in the region excepting the connected portions between the other semiconductor regions of the transfer MISFETs and the data lines so that it may be prevented from being shorted with the data lines. As a result, there is formed a portion in which the end portion of the plate electrode layer of the capacitance element is formed over the high resistance load element or the power source voltage line. Specifically, the plate electrode layer is patterned over the conductive layer, the high resistance load element or the power source voltage line. After the plate electrode layer made of that polycrystalline silicon film has been patterned by using the dry etching, the dielectric film other than below the plate electrode layer such as the silicon nitride film is removed or retracted by the dry etching or the wet etching such as the treatment with hot phosphoric acid. As a result, the side etching occurs in the dielectric film made of a thin film to drastically drop the breakdown voltage at the end portion of the plate electrode layer of the capacitance element so that the plate electrode layer is frequently shorted with the conductive layer acting as one electrode, the high resistance load element or the power source voltage line. This short-circuit further drops the electric reliability of the SRAM. Therefore, we have improved the SRAM of the first embodiment to develop a technique capable of improving the electric reliablity by providing a capacitance element for increasing the charge storage and by improving the breakdown voltage either between the electrodes of that capacitance element or between the electrode and another conductive layer.

The representative of the inventions to be disclosed in the second embodiment will be briefly described in the following.

There is provided a semiconductor integrated circuit device comprising a SRAM composed of a memory cell in which a power source voltage line is connected with the information storage node of a flip-flop circuit sequentially through a conductive layer and a high resistance load element, wherein a plate electrode layer is formed over the conductive layer through a dielectric film and wherein an insulation film for preventing the short-circuit is connected between the end portion of the plate electrode layer and the conductive layer, the high resistance load element or the power source voltage line.

Moreover, the short-circuit preventing insulation film is formed over the high resistance load element and used as an impurity inducing mask for forming the high resistance load element.

The structure of the present invention will be described in the following in connection with a mixed type semiconductor integrated circuit device (i.e., the "SRAM built-in type Bi-CMOS") having the SRAM and the bipolar transistor.

Figure 18:
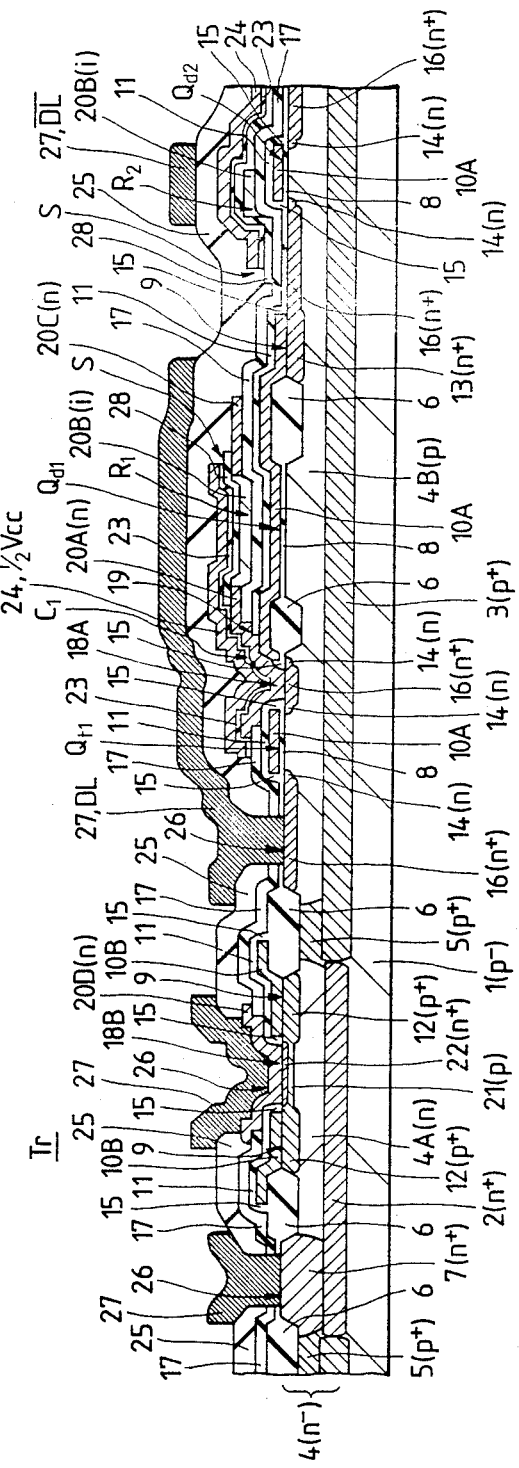
FIG. 18 is a section showing an essential portion of a semiconductor integrated circuit device having the memory cell and bipolar transistor of a SRAM according a second embodiment of the present invention.

FIG. 18 (in section of the essential portion) shows a semiconductor integrated circuit device having the memory cell of the SRAM and the bipolar transistor according to the second embodiment of the present invention.

FIG. 18 shows the memory cell M of the SRAM at its righthand side and the bipolar transistor Tr at its lefthand side.

The structure of the memory cell M is similar to the memory cell M of the first embodiment.

Next, the concrete structure of the memory cell M of the SRAM will be briefly described with reference to FIGS. 18 and 19 (in top plan view of the memory cell), but the repeated descriptions of the first embodiment will be omitted.

Figure 19:
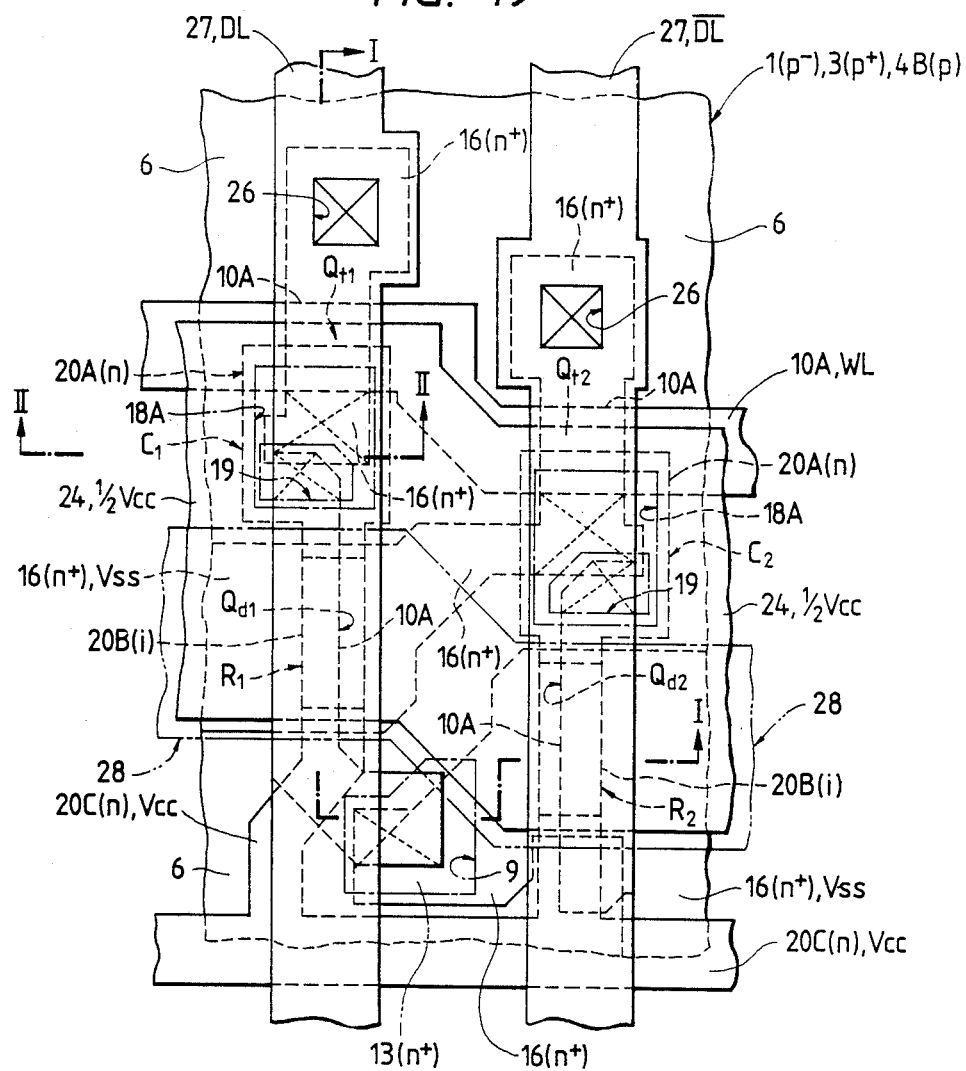
FIG. 19 is a top plan view showing the memory cell of the SRAM according to the second embodiment.

A plate electrode layer 24 is formed through a dielectric film 23, as shown in FIGS. 18 and 19, over the conductive layer 20A providing the image storage node of the flip-flop circuit of the aforementioned memory cell M. In other words, the capacity element $C_1$ is constructed of the conductive layer 20A, which has its one end connected with the connected portion between the one semiconductor region 16 of the transfer MISFET $Qt_1$ and the gate electrode 10A of the drive MISFET $Qd_1$, the dielectric film 23 and the plate electrode layer 24. The capacity element $C_2$ is constructed of the conductive layer 20A, which has its one end connected with the connected portion between the one semiconductor region 16 of the transfer MISFET $Qt_2$ and the gate electrode 10A of the drive MISFET $Qd_2$, the dielectric film 23 and the plate electrode layer 24.

The dielectric film 23 is formed over the conductive layer 20A and the high resistance load element 20B and below the plate electrode layer 24 and in the same shape. The dielectric film 23 is made of a single layer of a silicon nitride film having a thickness of about 100 to 200 [Å] so as to increase the individual charge storages of the capacity elements $C_1$ and $C_2$. Alternatively, the dielectric film 23 may be made of a composite film which is formed by laminating a silicon nitride and a silicon oxide film. This composite film is formed by oxidizing the surface of a silicon nitride film having a thickness of about 60 to 150 [Å], for example. In short, the dielectric film 23 is formed of an insulation film which is made mainly of the silicon nitride film. Moreover, the dielectric film 23 may be made of a tantalum oxide ($Ta_2O_5$) film or a composite film in which the tantalum oxide film, a silicon oxide film and a silicon nitride film are laminated.

The plate electrode layer 24 is formed over the dielectric film 23. The plate electrode layer 24 is made integral with such a plate electrode 24 of another memory cell M as is arranged in the same column direction as the extending direction of the word line 10A. The plate electrode layer 24 is supplied with the power source voltage ½ Vcc, as has been described hereinbefore. The plate electrode layer 24 is made of a polycrystalline silicon film which is deposited by the CVD, for example.

The plate electrode layer 24 is formed to extend in the row direction within the range between the connected portion (i.e., the connection hole 26) of the other individual semiconductor regions 16 of the transfer MISFETs $Qt_1$ and $Qt_2$ and the complementary data line 27 and the position excepting the power source voltage line 20C. In short, the plate electrode layer 24 is constructed to prevent the short-circuit with the complementary data line 27 and to prevent the parasitic capacitance from being added to the power source voltage line 20C. Specifically, the plate electrode layer 24 is constructed to have its one row-direction end positioned over the word line 10A. On the other hand, the other end portion of the plate electrode 24 in the row direction is positioned over the branched portion of the power source voltage line 20C connected with the high resistance load element 20B.

Over the high resistance load element ($R_1$ or $R_2$), there is formed the electric field shielding layer 24 through the dielectric film 23 acting as the interlayer insulation film 23. The electric field shielding layer 24 is formed between the high resistance load element 20B and the complementary data line 27. This electric field shielding layer 24 is constructed to prevent any parasitic channel from being formed in the high resistance load element 20B by the field effect of the complementary data line 27. In short, the field shielding layer 24 is constructed to prevent the parasitic MOS effect. The parasitic MOS is composed of the complementary data line 27 acting as its gate electrode, the inter-layer insulation film 25 as its gate insulation film, and the high resistance load element 20B as its channel forming region.

This electric field shielding layer 24 is integrally made of the same conductive layer as the aforementioned plate electrode layer 24. Specifically, the electric field shielding layer 24 is formed by extending the plate electrode layer 24 over the conductive layer 20A to over the high resistance load element 20B. As a result, the electric field shielding layer 24 is made of a polycrystalline silicon film and is supplied with the power source voltage ½ Vcc.

Thus, the semiconductor integrated circuit device has the SRAM in which the memory cell M is constructed to connect the high resistance load element ($R_1$ or $R_2$) with the information storage node of the flip-flop circuit through the conductive layer 20A and in which the complementary data line 27 extends over the high resistance load element 20B of the memory cell M. The capacity element C is constructed by forming the plate electrode layer 24, which is to be supplied with the predetermined potential through the dielectric film 23, over the conductive layer 20A connected with the information storage node, and the electric field shielding layer 24 for shielding the field effect from the complementary data line 27 is formed between the high resistance load element 20B and the complementary data line 27. As a result, the charge storage of the information storage node can be increased to prevent the software error, and the field effect from the complementary data line 27 can be shielded to prevent the parasitic channel from being formed in the high resistance load element 20B. Thus, it is possible to reduce the standby current flow rate and accordingly the power consumption.

By interposing the inter-layer insulation film 23 made mainly of the silicon nitride film between the high resistance load element 20B and the electric field shielding layer 24, moreover, it is possible in addition to the above-specified effects to prevent hydrogen in the inter-layer insulating film 23 from migrating into the high resistance load element 20B, the crystal properties of the high resistance load element (of the polycrystalline silicon film) 20B from being improved, and the threshold voltage of the parasitic MOS using the high resistance load element 20B as the channel forming region from being dropped. As a result, the standby current flow can be dropped to reduce the power consumption.

Incidentally, although not shown in FIG. 18, a passivation film is formed all over the surface of the substrate and over the complementary data line 27. This passivation film is formed of a silicon nitride film which is deposited by the plasma CVD, for example. This passivation film is a source for generating the aforementioned hydrogen.

As shown in FIGS. 18 and 19, a short-circuit preventing insulation film 28 is formed between the other end portion of the plate electrode layer 24 of the aforementioned capacity element C (actually, the other end portion of the electric field shielding layer 24) and the branched portion of the underlying power source voltage line 20C. This short-circuit preventing insulation film 28 is formed between the power source voltage line 20C and the dielectric film 23. The short-circuit preventing insulation film 28 is formed to extend in the row direction within the range between the connected portion (i.e., the connection hole 19) of the gate electrode 10A of the driver MISFET Qd and the conductive layer 20A and the position out of overlap upon the power source voltage line 20C extending in the column direction. Specifically, the short-circuit preventing insulation film 28 is formed over the high resistance load element 20B and with a larger than the shape of the same and positioned in self-alignment with the high resistance load element 20B in the row direction. The short-circuit preventing insulation film 28 arranged over each high resistance load element 20B is made integral in the column direction such that it apparently extends in the column direction. The short-circuit preventing insulation film 28 is also used as an impurity introducing mask for forming the high resistance load element 20B, the conductive layer 20A and the power source voltage line 20C, as will be described in detail in the later-described fabrication process.

In the portion S where the branched portion of the power source voltage line 20C and the end portion of the plate electrode layer 24 (i.e., the electric field shielding layer 24) are overlapped, as shown in FIG. 18, the end portion of the plate electrode layer 24 is formed over the short-circuit preventing insulation film 28. In short, the short-circuit preventing insulation film 28 is formed in addition to the dielectric film 23 between the end portion of the plate electrode layer 24 and the power source voltage line 20C to improve the breakdown voltage inbetween.

The short-circuit preventing insulation film 28 is made of a silicon oxide film deposited by the CVD, for example. This short-circuit preventing insulation film 28 may be made of a silicon nitride film but is preferably made of a silicon oxide film partly because the parasitic capacity is increased, partly because the etching treatment for forming the connection hole in the inter-layer insulation film (e.g., 17 and 25) made mainly of the silicon oxide film is difficult, and partly because the charge trap level is liable to occur in the interface between the silicon nitride film and the silicon oxide film. The short-circuit preventing insulation film 28 is formed to have a thickness of about 2,000 to 3,000 [Å], for example, so as to retain the breakdown voltage and to be used as an impurity introducing mask.

The short-circuit preventing insulation film 28 thus constructed is formed in the branched portion of the power source voltage line 20C because the end portion of the plate electrode layer 24 (i.e., the electric field shielding layer 24) because the end portion of the plate electrode layer 24 is overlapped on the branched portion of the power source voltage line 20C. In case, however, the plate electrode layer 24 has its end portion exists to overlie the conductive layer 20A or the high resistance load element 20B, the short-circuit preventing insulation film 28 is also formed in that position.

Thus, there is provided the semiconductor integrated circuit comprising the SRAM having the memory cell M, in which the power source voltage line 20C is connected with the information storage node of the flip-flop circuit through the conductive layer 20A and the high resistance load element 20B sequentially in the recited order. The plate electrode layer 24 is formed over the conductive layer 20A through the dielectric film 23, and the short-circuit preventing insulation film 28 is formed between the end portion of the plate electrode layer 24 and the conductive layer 20A, the high resistance load element 20B or the power source voltage line 20C so that the charge storage of the information storage node can be increased by the capacitance element C composed of the conductive layer 20A, the dielectric film 23 and the plate electrode layer 24 thereby to prevent the software errors. At the same time, the breakdown voltage between the end portion of the plate electrode layer 24 of the capacitance element C and the conductive layer 20A, the high resistance load element 20B or the power source voltage line 20C can be improved by the short-circuit preventing insulation film 28 to improve the electric reliability.

The bipolar transistor Tr is constructed in the main surface of an n-type well region 4A, as shown at the lefthand side of FIG. 18. The well region 4A is formed in the main surface portion of the epitaxial layer 4 (or formed of the epitaxial layer 4 itself). Between the semiconductor substrate 1 and the well region 4A, there is formed an n+-type semiconductor region (or a buried semiconductor region layer) 2. This semiconductor region 2 is formed to reduce the collector resistance of the bipolar transistor Tr.

The field insulation film 6 and the semiconductor region 5 are interposed between the bipolar transistors Tr to electrically separate the bipolar transistors Tr. Each of the bipolar transistors Tr is constructed of the npn type having a collector region, a base region and an emitter region.

The collector region is composed of the well region 4A a potential raising n+-type semiconductor region 7 and the buried semiconductor region 2. The potential raising semiconductor region 7 is formed in the main surface portion of the well region 4A such that it extends from the main surface of the well region 4A to the buried semiconductor region 2. The collector wiring line 27 is connected with the semiconductor region 7 through the connection hole 26 formed in the inter-layer insulation film 25.

The base region is constructed of a p+-type semiconductor region 12 acting as an external base region and a p-type semiconductor region 21 acting as an activating base region. The semiconductor region 12 as the external base region is formed in a ring shape defined by the field insulation film 6. The semiconductor region 21 as the activating base region is formed at the central portion of the semiconductor region 12 acting as the external base region.

A base electrode 10B is connected through the connection hole 9 with the base region. The base electrode 10B is constructed by introducing a p-type impurity (e.g., B or $BF_2$) into the polycrystalline silicon film which is made of the same conductive layer as the aforementioned gate electrode 10A. The semiconductor region 12 as the external base region is formed by diffusing the p-type impurity, which is introduced into the base electrode 10B, into the main surface portion of the well region 4A. In short, the semiconductor region 12 as the external base region is constructed in self-alignment with the base electrode 10B. With the base electrode 20B, although not shown, there is connected the base wiring line which is made of the same conductive layer as the collector wiring layer 27.

The emitter region is made of an n+-type semiconductor region 22. This semiconductor region 22 is formed in the main surface portion of the semiconductor region acting as the aforementioned activating base region. An emitter electrode 20D is connected with the emitter region through a connection hole 18B. This connection hole 18B is formed in an opening formed in the inter-layer insulation film 17 and within the region which is defined by the side wall spacers 15 formed on the side walls of the base electrode 10B. In short, the connection hole 18B is constructed to have substantially the same structure as that of the connection hole 18A formed in the memory cell M of the aforementioned SRAM. The emitter electrode 20D is made of a polycrystalline silicon film which is formed of the same conductive layer of each of the conductive layer 20A, high resistance load element 20B and power source voltage line 20C of the memory cell M of the SRAM and which is doped with an n-type impurity and a p-type impurity having a lower concentration than that of the former n-type impurity. The emitter region (i.e., the semiconductor region 22) is formed through diffusion in the main surface portion of the semiconductor region 21 by subjecting the n-type impurity (e.g., As or P), which is introduced into the polycrystalline silicon film of the emitter electrode 20D, to a heat treatment. On the other hand, the esmiconductor region 21 as the activating base region can be formed by a similar method. The emitter wiring line 27 is connected with the emitter electrode 20D through the connection hole 26 formed in the inter-layer insulation film 25.

Next, a concrete process for fabricating the aforementioned semiconductor integrated circuit device will be briefly described with reference to FIGS. 20 and 21 (in sections showing the essential portion at the individual fabrication steps).

Incidentally, the repeated description of the first embodiment will be omitted.

In accordance with the individual fabrication steps having been described with reference to FIGS. 6 to 12, the connection hole 19 is formed by using the etching mask, as indicated broken lines in FIG. 12.

Next, as shown in FIG. 20, the high resistance load elements ($R_1$ and $R_2$) and the power source voltage line 20C are formed in the region to be formed with the memory cell M, and the emitter electrode 20D is formed in the region to be formed with the bipolar transistor Tr.

The conductive layer 20A is formed over the inter-layer insulation film 17 to have its one end connected through the connection hole 18A with the respective one-side semiconductor regions 16 of the transfer MISFETs $Qt_1$ and $Qt_2$ and its other end connected through the connection hole 19 with surfaces of the respective gate electrodes 10A of the drive MISFETs $Q_d$ and $Qd_2$. The conductive layer 20A is formed of a polycrystalline silicon film doped with an n-type impurity (e.g., P), for example, to have a thickness of about 2,000 to 3,000 [Å].

The high resistance load element 20B has its one end made integral with the other end of the aforementioned conductive layer 20A and its other end made integral with the power source voltage line 20C. In short, the high resistance load element 20B formed at the fabrication step shared with the conductive layer 20A. The high resistance load element 20B is made of an i-type polycrystalline silicon film which is either undoped or doped with a small amount of n- or p-type impurity.

The power source voltage line 20C is made of a polycrystalline silicon film doped with an n-type impurity at the fabrication step shared with the conductive layer 20A.

A concrete process for forming those conductive layer 20A, high resistance load element 20B and power source voltage line 20C will be briefly described with reference to FIGS. 22 to 25 (in schematic sections showing the essential portion at the individual fabrication steps).

First of all, the polycrytalline silicon film 20E is deposited all over the surface of the substrate and over the inter-layer insulation film 17 such that its one portion is connected through the connection hole 18A with the one-side semiconductor regions of the transfer MISFETs $Qt_1$ and $Qt_2$ whereas its other portion is connected through the connection hole 19 with the gate electrodes 10A of the drive MISFETs $Qd_1$ and $Qd_2$.

That polycrytalline silicon film 20E is doped with a small amount of impurity or not.

Figure 22:
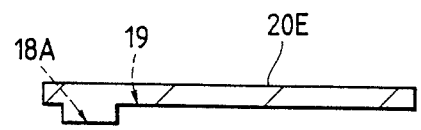
FIGS. 22 to 25 are sections showing the essential portion of the memory cell of the SRAM according to the second embodiment at the individual fabrication steps.

Next, as shown in FIG. 22, the polycrystalline silicon film 20E is patterned so that the individual regions of the conductive layer 20A, the high resistance load element 20B and the power source voltage line 20C may be left. This patterning is accomplished by the anisotropic etching such as the RIE, for example.

Figure 23:
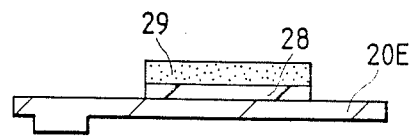

Next, as shown in FIG. 23, the short-circuit preventing insulation film 28 is formed over the region to be formed with the high resistance load element 20B of the polycrystalline silicon film 20E. This short-circuit preventing insulation film 28 is made of a silicon oxide film deposited by the CVD and patterned by an etching mask 29 made of a photo resist film.

Figure 24:
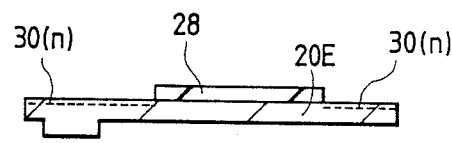

Next, as shown in FIG. 24, an n-type impurity (e.g., As or P) 30 is introduced into a polycrystalline silicon film 20E excepting the portion, wherein the short-circuit preventing insulation film 28 is present, by removing the etching mask 29 and by using the short-circuit preventing insulation film 28 as the impurity introducing mask. The n-type impurity 30 to be used is AS in an impurity concentration of about $10^{14}$ to $10^{17}$ [atoms/cm$^2$] and is introduced into by the ion implantation of about 40 to 100 |KeV|. Incidentally, for the introduction of the impurity 30, a thin silicon oxide film may be formed as a buffer layer on the surface of the polycrystalline silicon film 20E.

Figure 25:
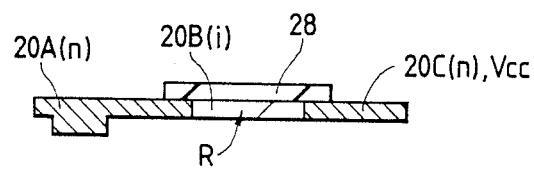

Next, as shown in FIG. 25, the n-type impurity 30 thus introduced is subjected to a subsequent heat treatment to form the conductive layer 20A and the power source voltage line 20C of the polycrystalline silicon film 20E doped with the n-type impurity 30, and the high resistance load element 20B is formed of the polycrystalline silicon film 20E underlying the short-circuit preventing insulation film 28 and undoped with the n-type impurity 30. The short-circuit preventing insulation film 28 is left as it is over the high resistance load element 20B.

The aforementioned emitter electrode 20D is formed over the inter-layer insulation film 17 such that it is connected directly with the main surface of the well region 4A through the connection hole 18B. The emitter electrode 20D is made of an n-type polycrystalline silicon film formed at the fabrication step shared with the foregoing conductive layer 20A and the power source voltage line 20C. In the main surface portion of the well region 4A below that emitter electrode 20D, as shown in FIG. 20, the p-type semiconductor region 21 for providing the activating base region and the n$+$-type semiconductor region 22 for providing the emitter region are formed by depositing a polycrystalline silicon film by the CVD, by introducing n- and p-type impurities into the polycrystalline silicon film and by subjecting it to a heat treatment. Specifically, the semiconductor region 21 is made of diffusing thereinto the p-type impurity such as boron (B) which has been introduced into the polycrystalline silicon film of the emitter electrode 20D. On the other hand, the semiconductor region 22 is formed by diffusing thereinto the n-type impurity such as arsenic (As) which has been introduced into the polycrystalline silicon film of the emitter electrode 20D. Since the diffusion coefficient of the boron (B) in the substrate is larger than that of the arsenic (As), the semiconductor region 21 is formed in a deeper position of the substrate than the semiconductor region 22. Since the concentration of the arsenic (As) is sufficiently higher than that of the boron (B), the semiconductor region 22 and the polycrystalline silicon film of the emitter electrode 20D exhibit the n-type. The bipolar transistor Tr is completed by forming the aforementioned emitter electrode 20D and semiconductor regions 21 and 22.

Thus, there is fabricated the semiconductor integrated circuit device comprising; the SRAM constructed of the memory cell M, in which the one semiconductor region 16 of the transfer MISFET Qt and the gate electrode 10A of the drive MISFET Qd are connected and in which the high resistance load elements (R$_1$ or R$_2$) connected through the conductive layer 20A with that connected portion is arranged over the drive MISFET Qd; and the bipolar transistor Tr, in which the emitter electrode 20D is connected with the inside of the region defined by the base electrode. This semiconductor integrated circuit device is fabricated by the process comprising: the step of forming the gate electrode 10A of the transfer MISFET Qt and the gate electrode 10A of the drive MISFET Qd of the memory cell M of the SRAM and the base electrode 10B of the bipolar transistor Tr and forming the inter-layer insulation film 11 over the gate electrodes 10A and the base electrode 10B; the step of forming the side wall spacers 15 on the individual side walls of the gate electrodes 10A and the base electrode 10B; the step of forming the inter-layer insulation film 17 all over the surface of the substrate and over the inter-layer insulation film 11; the step of forming the connection hole 18A defined by the inter-layer insulation film 17 and the side wall spacers 15 by removing the inside of the region, which is defined by the gate electrode 10A of the transfer MISFET Qt and the gate electrode 10A of the drive MISFET Qd, and the inter-layer insulation film 17 over a predetermined portion of the gate electrode 10A of the drive MISFET Qd and forming the connection hole 18B defined by the inter-layer insulation film 17 and the side wall spacers 15 by removing the inter-layer insulation film 17 inside of the region defined by the base electrode 10B; the step of forming the connection hole 19 by removing the inter-layer insulation film 11 over a predetermined portion of the gate electrode 10A of the drive MISFET Qd in the connection hole 18A; and the step of forming over the inter-layer insulation film 17 the conductive layer 20A, which has its one end connected with the one semiconductor region 16 of the transfer MISFET Qt through the connection hole 18A and its other end connected with the gate electrode 10A of the drive MISFET Qd through the connection hole 19, the high resistance load element 20B made integral with the conductive layer 20A and forming over the interplayer insulation film 17 the emitter electrode 20D connected with the well region 4A (i.e., the emitter region) through the connection hole 18B. As a result, the step of forming the connection hole 18A of the memory cell M of the SRAM can be shared with the step of forming the connection hole 18B of the bipolar transistor Tr so that the number of fabrication steps of fabricating the semiconductor integrated circuit device can be reduced by an extent corresponding to the step of forming the connection hole 18A.

Moreover, the step of forming the conductive layer 20A and high resistance load element 20B of the memory cell M of the SRAM can be shared with the step of forming the emitter electrode 20D of the bipolar transistor Tr so that the number of fabrication steps of fabricating the semiconductor integrated circuit device can be reduced by an extent corresponding to the step of forming the conductive layer 20A and the high resistance load element 20B.

Next, as shown in FIG. 21, in the region to be formed with the memory cell M, the plate electrode layer 24 is formed over the conductive layer 20a through the dielectric film 23 to form the capacity elements $C_1$ and $C_2$. At the same fabrication step as that of forming the capacity element C, the electric field shielding layer 24 is formed over each of the high resistance load element ($R_1$ and $R_2$) through the short-circuit preventing insulation film 28 and the dielectric film 23 as the inter-layer insulation film 23.

The dielectric film 23 and the dielectric film 23 of the inter-layer insulation film 23 are formed at the common fabrication step. The dielectric film 23 is made of a single-layered silicon nitride film, which is deposited by the CVD, for example, so as to improve the dielectric coefficient and is made to have a thickness of about 100 to 200 [Å]. The dielectric film 23 and the inter-layer insulation film 23 are patterned by using the plate electrode layer 24 and the electric field shielding layer 24 as the etching mask.

The aforementioned plate electrode 24 and electric field shielding layer 24 are formed at the common fabrication step. The plate electrode layer 24 and the electric field shielding layer 24 are formed of a polycrystalline silicon film deposited by the CVD, for example, to have a thickness of about 1,500 to 3,000 [Å]. This polycrystalline silicon film is doped with an n-type impurity.

Thus, there is provided a process for fabricating the semiconductor integrated circuit device comprising the SRAM having the memory cell M, in which the power source voltage line 20C is connected with the information storage node of the flip-flop circuit through the conductive layer 20A and the high resistance load element 20B sequentially in the recited order. This fabrication process comprises: the step of forming the silicon film (i.e., the polycrystalline silicon film) 20E in each of the regions to be formed with the conductive layer 20A, the high resistance load element 20B and the power source voltage line 20C; the step of forming the short-circuit preventing insulation film 28 over the region to be formed with the high resistance load element 20B of the silicon film 20E; the step of forming the conductive layer 20A and the power source voltage line 20C in the region, which is doped with the impurity 30 of the silicon film 20E, by introducing the impurity 30 into the region of the silicon film 20E to be formed with the conductive layer 20A and the power source voltage line 20C, by using the short-circuit preventing insulation film 28, and forming the high resistance load element 20B in the region of the silicon film 20E left undoped with the impurity 30; and the step of forming the plate electrode layer 24 (or the electric field shielding layer 24) by interposing the dielectric film 23 over the conductive layer 20A such that its one end portion exists over the short-circuit preventing insulation film 28. As a result, this short-circuit preventing insulation film 28 can be used as the impurity introducing mask for forming the high resistance load element 20B so that the number of the fabrication steps can be reduced to an extent corresponding to the step of forming the short-circuit preventing insulation film 28.

Next, the inter-layer insulation film 25 is formed all over the substrate including the plate electrode 24 and the field effect shielding layer 24. The interlayer insulation film 25 is made of a composite film in which a BPSG film having a thickness of about 4,000 to 6,000 [Å] deposited by the CVD is laminated over a silicon oxide film having a thickness of about 100 to 500 [Å] deposited by the CVD, for example. The BPSG film softens the step shape resulting from the multilayered wiring structure to improve the step coverage of the upper layer line. The silicon oxide film is formed to prevent the leakage of B or P from the BPSG film.

Next, the connection hole 26 is formed by removing the inter-layer insulation film 25 and so on lying over the other semiconductor regions 16 of the transfer MISFETs $Qt_1$ and $Qt_2$ of the memory cell M, the semiconductor region 7 for raising the potential of the bipolar transistor Tr and the emitter electrode 20D.

Next, as shown in FIGS. 18 and 19, the complementary data lines (DL) 27, the collector wiring line 27, the emitter wiring line 27 and the base wiring line are formed over the inter-layer insulation film 25. These wiring lines 27 are connected through the connection hole 26 with the individual regions.

Next, although not shown, the passivation film is formed all over the surface of the substrate including the wiring lines 27. The passivation film is made of a silicon nitride film deposited by the plasma CVD.

The semiconductor integrated circuit device of the present embodiment is completed by a series of those fabrication steps.

Thus, there is fabricated the semiconductor integrated circuit device comprising the SRAM which has the memory cell M connecting the high resistance load elements ($R_1$ and $R_2$) with the information storage nodes of the flip-flop circuit and in which the complementary data lines 27 extend over the high resistance load element 20B of the memory cell M. At the same fabrication step as the step of forming the capacity element C by forming the plate electrode layer 24, which is to be supplied with a predetermined potential through the dielectric film 23, over the conductive layer 20A to be connected with the storage nodes, the electric field shielding layer 24 for shielding the field effect from the complementary data lines 27 is formed between the high resistance complementary load element 20B and the complementary data lines 27 so that the step of forming the plate electrode layer 24 can be shared with the step of forming the electric field shielding layer 24. As a result, the number of fabrication steps of the semiconductor integrated circuit device can be reduced by an extent corresponding to the step of forming the electric field shielding layer 24.

At the same step as the step of forming the dielectric film 23 over the conductive layer 20A, moreover, the step of forming the inter-layer insulation film 23 can be shared with the step of forming the dielectric film 23 so that the number of fabrication steps of the semiconductor integrated circuit device can be reduced by an extent corresponding to the step of forming the inter-layer insulation film 23.

Figure 26:
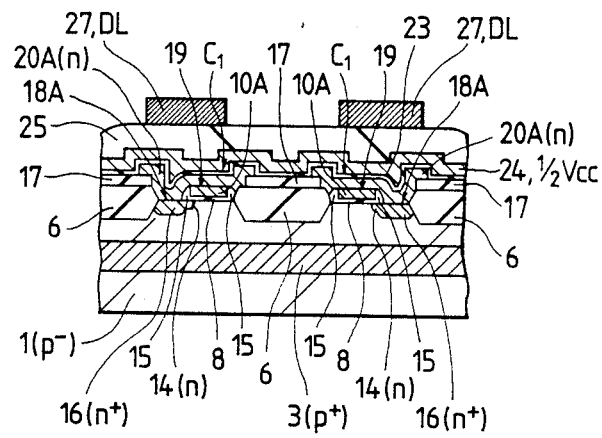
FIG. 26 is an essential section taken along line II—II of FIG. 19.

As shown in FIG. 26 (in section showing an essential portion and taken along line II—II of FIG. 19), on the other hand, a high breakdown voltage is set between the respective transfer MISFETs $Qt_1$ and $Qt_1$, and $Qt_2$ and $Qt_2$ of the two memory cells M adjoining in the row direction of the SRAM. Specifically, the individual one-side semiconductor regions 16 of the transfer MISFETs $Qt_1$ and $Qt_2$ are made of an n-type impurity introduced by the ion implantation but not by the thermal diffusion like the semiconductor region 13 forming part of the drain region of the drive MISFET $Qd_2$ so that the pn junction of the semiconductor regions 16 can be made shallow to reduce the run-around of the semiconductor regions 16 below the field insulation layer 6. As a result, the size of the clearance between the memory cells M adjoining in the row direction can be reduced to better improve the integration of the SRAM.

As shown in FIG. 27 (in a top plan view showing the essential portion of the memory cell), on the other hand, the present invention may be constructed such that the electric field shielding layer 24 and the dielectric film 23 are not formed in all the region or one region over the high resistance load element 20B of the memory cell M. This structure is made to prevent the reduction of the threshold voltage (i.e., the resistance of the high resistance load element 20) of the parasitic MOS because the dielectric film 23 is liable to be charged up when it is patterned by the dry process. As a result, the power consumption of the SRAM can be reduced.

In the present invention, moreover, the aforementioned short-circuit preventing insulation film 28 need not be used as the impurity introducing mask for forming the high resistance load element 20B. In this case, the short-circuit preventing insulation film 28 can be formed by a fabrication process independent of that for the high resistance load element 20B and the power source voltage line 20C. In short, the short-circuit preventing insulation film 28 can be formed as the inter-layer insulation film not only between the end portion of the plate electrode 24 and the conductive layer 20A, the high resistance load element 20B or the power source voltage line 20C but also between the power source voltage line 20C and the complementary data line 27, in the region for forming the bipolar transistor Tr and in the wiring region. Thus, the short-circuit preventing insulation film 28 to be used as the interlayer insulation film can reduce the parasitic capacity added to the complementary data line 27 and so on.

Although our invention has been thus far described specifically in connection the foregoing embodiments, it should not be limited to those embodiments but can naturally be modified in various manners without departing from the gist thereof.

The effects to be obtained from the representative of the invention to be disclosed herein will be briefly described in the following.

The charge storage of the information storage node can be increased by the capacity element composed of the aforementioned conductive layer, dielectric film and plate electrode layer so that the software errors can be prevented. At the same time, the breakdown voltage between the end portion of the plate electrode layer of the capacity element and the conductive layer, the high resistance load element or the power source voltage line can be improved by the short-circuit preventing insulation film to improve the electric reliabliity.

Still moreover, the short-circuit preventing insulation film can also be used as the impurity introducing mask for forming the high resistance load element so that the number of the fabrication steps can be reduced to an extent corresponding to the step of forming the short-circuit preventing insulation film.

What is claimed is:

1. A semiconductor integrated circuit device including a SRAM having a plurality of memory cells arranged to correspond to the intersections of data and word lines, wherein each memory cell comprises:
   a flip-flop circuit having two driver MISFETs;
   two high resistance load elements; and
   two transfer MISFETs
   wherein said high resistance load elements are connected, through a conductive layer which is integrally made with said high resistance load elements, with the information storage nodes of said flip-flop circuit, wherein a plate electrode layer to be supplied with a predetermined potential is formed over said conductive layer through a dielectric film, and wherein an electric field shielding layer which is integrally made with said plate electrode is formed between said high resistance load elements and said data line which extends thereover, said electric field shielding layer being separated from said resistance load elements by an insulator film of a thickness greater than the thickness of said dielectric film.

2. A semiconductor integrated circuit device according to claim 1, wherein said electric field shielding layer is a film for shielding the field effect of said data lines.

3. A semiconductor integrated circuit device according to claim 1, wherein said plate electrode layer and said electric field shielding layer are made of a polycrystalline silicon film.

4. A semiconductor integrated circuit device according to claim 1, wherein said electric field shielding layer is supplied with the same potential as that supplied to said plate electrode layer.

5. A semiconductor integrated circuit device according to claim 4, wherein the potential supplied to said plate electrode layer and said electric field shielding layer is at an intermediate potential between a power source voltage and a reference voltage.

6. A semiconductor integrated circuit device according to claim 1, further comprising an inter-layer insulation film formed between said high resistance load elements and said electric field shielding layer and at the fabrication step shared with that for said dielectric film.

7. A semiconductor integrated circuit device according to claim 6, wherein said inter-layer insulation film is made of a silicon nitride film.

8. A semiconductor integrated circuit device according to claim 7, wherein said inter-layer insulation film is made of a composite film having a silicon nitride film and a silicon oxide film overlaid one on the other.

9. A semiconductor integrated circuit device according to claim 1, wherein said conductive layer has one end thereof electrically connected with one of the source and drain semiconductor regions of said transfer MISFETs and its other end thereof is electrically connected with the upper surfaces of the gate electrodes of said driver MISFETs associated therewith, which are defined by the gate electrodes of said transfer MISFETs and the gate electrodes of said driver MISFETs, in selfalignment with said individual gate electrodes and which are electrically isolated from the gate electrodes of said transfer MISFETs.

10. A semiconductor integrated circuit device comprising:
   a data line constituted as a set of complementary data lines, said set comprising a pair of complementary data lines which are coupled to an identical memory cell;
   a memory cell which comprises cross-coupled first and second driver MISFETs and first and second switching MISFETs, each one of said first and second switching MISFETs being coupled between a respective one of said first and second driver MISFETs and a data line of a pair of complementary data lines associated therewith;
   first semiconductor layers respectively comprise high resistance load elements and are respectively coupled to said first and second driver MISFETs of said memory cell;

wiring lines being electrically connected to said first semiconductor layers and supplying a power source voltage to said memory cell;

a plate electrode layer being disposed over said first semiconductor layers and between said high resistance elements and said pair of complementary data lines which are associated therewith and which extends thereover, said plate electrode layer having a predetermined potential supplied thereto; and a short-circuit preventing insulation film being disposed between said plate electrode layer and said high resistance load elements, wherein one end portion of said plate electrode layer is disposed over said short-circuit preventing insulation film.

11. A semiconductor integrated circuit device according to claim 10, wherein said, short-circuit preventing insulation film is made from one of a silicon oxide film and a silicon nitride film.

12. A semiconductor integrated circuit device according to claim 10, wherein said short-circuit preventing insulation film is formed over said high resistance load elements.

13. A semiconductor integrated circuit device according to claim 10, wherein said short-circuit preventing insulation film is formed over said high resistance load elements and said power source voltage wiring lines.

14. A semiconductor integrated circuit device according to claim 10, wherein said short-circuit preventing insulation film is formed between said plate electrode layer, and at least one of said high resistance load elements and said power source voltage line, and wherein a dielectric film is disposed below an end portion of said plate electrode layer.

15. A semiconductor integrated circuit device according to claim 10, wherein said plate electrode layer is made integrally with an electric field shielding layer formed between said high resistance load element and a data line extending over the region of the former.

16. A semiconductor integrated circuit device according to claim 10, further comprising an insulation film made mainly of a silicon nitride film is formed between said high resistance load element and a data line extending over the region of the former.

17. A semiconductor integrated circuit device according to claim 12, where said short-circuit preventing insulation film is formed over said high resistance load elements so as to cover at least a part of both said high resistance load elements.

18. A semiconductor integrated circuit device according to claim 12, wherein said short-circuit preventing insulation film is formed over said high resistance load elements so as to cover substantially the entire high resistance load elements.

19. A semiconductor integrated circuit device according to claim 10, wherein a dielectric film is disposed below said plate electrode layer.

20. A semiconductor integrated circuit device including a SRAM having a plurality of memory cells arranged so as to be respectively coupled to corresponding ones of an intersecting arrangement of data and word lines, comprising:

a flip-flop circuit constituting a memory cell, said flip-flop circuit having two driver MISFETs and two high resistance load elements respectively coupled therewith, each of said high resistance load elements being made integrally with a first semiconductor layer which is electrically connected to information storage nodes of said flip-flop circuit;

a wiring line being connected to said first semiconductor layer and supplying a power source voltage to said memory cell;

a plate electrode layer being disposed over said first semiconductor layer and between said high resistance elements and said data line extending thereover;

a dielectric film disposed between said first semiconductor layer and said plate electrode layer; and a short-circuit preventing insulation film being disposed between said plate electrode layer and said high resistance load elements, wherein said dielectric film is disposed between said plate electrode layer and said high resistance load elements, through said short-circuit preventing insulation film, and wherein one end portion of said plate electrode layer is disposed over said short-circuit preventing insulation film.

* * * * *